United States Patent
Kawai et al.

(10) Patent No.: US 10,047,204 B2
(45) Date of Patent: Aug. 14, 2018

(54) ETHYLENE-VINYL ALCOHOL COPOLYMER-CONTAINING RESIN COMPOSITION, FILM, LAMINATE, PACKAGING MATERIAL, VACUUM THERMAL INSULATOR, FILM PRODUCTION METHOD, AND LAMINATE PRODUCTION METHOD

(71) Applicant: KURARAY CO., LTD., Kurashiki-shi (JP)

(72) Inventors: Hiroshi Kawai, Kurashiki (JP); Yasuhiro Nonaka, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 14/894,459

(22) PCT Filed: May 28, 2014

(86) PCT No.: PCT/JP2014/064200
§ 371 (c)(1),
(2) Date: Nov. 27, 2015

(87) PCT Pub. No.: WO2014/192838
PCT Pub. Date: Dec. 4, 2014

(65) Prior Publication Data
US 2016/0108193 A1    Apr. 21, 2016

(30) Foreign Application Priority Data

May 29, 2013 (JP) ................................. 2013-113106
Sep. 10, 2013 (JP) ................................. 2013-187795
Sep. 20, 2013 (JP) ................................. 2013-196246
Sep. 20, 2013 (JP) ................................. 2013-196248
Oct. 2, 2013 (JP) ................................. 2013-207777
Oct. 2, 2013 (JP) ................................. 2013-207778
Mar. 10, 2014 (JP) ................................. 2014-046461

(51) Int. Cl.
| | |
|---|---|
| *C08J 5/18* | (2006.01) |
| *C08K 3/01* | (2018.01) |
| *C08K 3/00* | (2018.01) |
| *C08K 5/07* | (2006.01) |
| *C23C 14/14* | (2006.01) |
| *C08J 7/06* | (2006.01) |
| *C08K 3/22* | (2006.01) |
| *C08K 3/36* | (2006.01) |

(52) U.S. Cl.
CPC . *C08J 5/18* (2013.01); *C08J 7/06* (2013.01); *C08K 3/0008* (2013.01); *C08K 3/01* (2018.01); *C08K 3/22* (2013.01); *C08K 3/36* (2013.01); *C08K 5/07* (2013.01); *C23C 14/14* (2013.01); *C08J 2323/08* (2013.01); *C08J 2329/04* (2013.01); *C08K 2003/222* (2013.01); *C08K 2003/2213* (2013.01); *C08K 2003/2227* (2013.01); *C08K 2003/2244* (2013.01); *C08K 2003/2255* (2013.01)

(58) Field of Classification Search
CPC ... C08J 5/18; C08J 7/06; C08J 2323/08; C08J 2329/04; C08L 29/04; C08K 3/0008; C08K 3/22; C08K 3/36; C08K 5/07
See application file for complete search history.

(56) References Cited

U.S. PATENT DOCUMENTS

| | | | |
|---|---|---|---|
| 9,163,131 B2 | 10/2015 | Nakazawa et al. | |
| 2002/0143098 A1 | 10/2002 | Kawai et al. | |
| 2007/0178314 A1* | 8/2007 | Marumoto | B32B 17/10036 428/426 |
| 2011/0045251 A1 | 2/2011 | Kazeto et al. | |
| 2011/0070442 A1* | 3/2011 | Asano | C08G 75/23 428/402 |

(Continued)

FOREIGN PATENT DOCUMENTS

| | | |
|---|---|---|
| JP | 55-157641 A | 12/1980 |
| JP | 05-179001 A | 7/1993 |

(Continued)

OTHER PUBLICATIONS

Machine Translation of JP 05179001 A.*
JP 05-179001 Machine Translation.*
JP 11-140136 Machine Translation.*
U.S. Appl. No. 14/842,955, filed Sep. 2, 2015, Nakazawa, et al.
International Search Report dated Aug. 26, 2014, for PCT/JP2014/064200 Filed May 28, 2014.
Fang Guozhi, et. al., "Examples of Processing and Application of the Product" Chemical Industry Press, Jan. 31, 2010, p. 267 (with partial English translation and cover pages).

(Continued)

*Primary Examiner* — Maria V Ewald
*Assistant Examiner* — Zachary M Davis
(74) *Attorney, Agent, or Firm* — Oblon, McClelland, Maier & Neustadt, L.L.P.

(57) ABSTRACT

Provided is a resin composition that achieves superior appearance characteristics such as a color of a film end (or a roll end) after melt molding, film-breaking resistance, blocking resistance, vapor deposition defects-inhibiting properties, and adhesive strength of a vapor deposition layer. The resin composition contains: an ethylene-vinyl alcohol copolymer; inorganic particles; and an aliphatic carbonyl compound having 3 to 8 carbon atoms, in which the content of the inorganic particles is 50 ppm or greater and 5,000 ppm or less, the aliphatic carbonyl compound is at least one selected from the group consisting of a saturated aldehyde, an unsaturated aldehyde and a saturated ketone, and the content of the aliphatic carbonyl compound is 0.01 ppm or greater and 100 ppm or less. The inorganic particles preferably contain a metal element which is at least one selected from the group consisting of silicon, aluminum, magnesium, zirconium, cerium, tungsten and molybdenum.

14 Claims, No Drawings

(56) References Cited

U.S. PATENT DOCUMENTS

| | | |
|---|---|---|
| 2012/0028058 A1 | 2/2012 | Paolilli et al. |
| 2015/0041462 A1 | 2/2015 | Nakazawa et al. |
| 2015/0152256 A1 | 6/2015 | Nakazawa et al. |
| 2015/0159005 A1 | 6/2015 | Nakazawa et al. |

FOREIGN PATENT DOCUMENTS

| | | | | |
|---|---|---|---|---|
| JP | 05179001 A | * | 7/1993 | |
| JP | 11-140136 A | | 5/1999 | |
| JP | 11140136 A | * | 5/1999 | ............ C08F 218/08 |
| JP | 2000-265024 A | | 9/2000 | |
| JP | 2001-146539 A | | 5/2001 | |
| JP | 2002-60403 A | | 2/2002 | |
| JP | 2002-284887 A | | 10/2002 | |
| JP | 2002-310385 A | | 10/2002 | |
| JP | 2004-124028 A | | 4/2004 | |
| JP | 2005-290108 A | | 10/2005 | |
| JP | 2009-242645 A | | 10/2009 | |
| JP | 2010-155206 A | | 7/2010 | |
| WO | 2005/014716 A1 | | 2/2005 | |
| WO | 2008-044549 A1 | | 4/2008 | |
| WO | 2013/125564 A1 | | 8/2013 | |
| WO | 2013/146961 A1 | | 10/2013 | |
| WO | 2013/187454 A1 | | 12/2013 | |
| WO | 2013/187455 A1 | | 12/2013 | |

OTHER PUBLICATIONS

"Xiandai Shipin Gongcheng Jishu" Zhengzhou University Press, May 31, 2011, pp. 215-216 (with partial English translation and cover pages).

* cited by examiner

ETHYLENE-VINYL ALCOHOL COPOLYMER-CONTAINING RESIN COMPOSITION, FILM, LAMINATE, PACKAGING MATERIAL, VACUUM THERMAL INSULATOR, FILM PRODUCTION METHOD, AND LAMINATE PRODUCTION METHOD

TECHNICAL FIELD

The present invention relates to a resin composition containing an ethylene-vinyl alcohol copolymer (hereinafter, may be abbreviated as "EVOH"), a film formed from the resin composition, a laminate having a layer including the film, a packaging material including the film or the laminate, a vacuum thermal insulator including the laminate, a production method of the film, and a production method of the laminate.

BACKGROUND ART

EVOH resin compositions are superior in gas barrier properties. Thus, the EVOH resin compositions have been molded into films, sheets, containers, etc. and widely used as various types of packaging materials, etc. For example, an EVOH film constitutes a laminate together with a thermoplastic resin film superior in moisture resistance, mechanical characteristics, etc., especially a film of polyolefin-derived resin, leading to use in a variety of fields as a packaging material. Such a packaging material has been widely used as a container superior in, e.g., oxygen barrier properties, in the form of a bag, a tube, a cup, a pouch or the like in fields including foods, cosmetics, medical drugs, chemicals, toiletries, and vacuum thermal insulated panels. In addition, such a packaging material has also been used in fields in which barrier properties against evaporated gasoline are required, such as gasoline tanks of automobiles. EVOH resin compositions for use in packaging materials in these fields are required to satisfy various characteristics as in the following.

The aforementioned EVOH resin compositions are required to exhibit superior appearance characteristics also after melt molding, e.g., the absence of yellow coloration on the end face of a roll obtained after winding the EVOH resin compositions in the form of a roll in a film molding step.

Moreover, the EVOH resin compositions are also required to achieve a reduction of a break of a film which may occur due to tension between rolls in a film-unwinding step or the like in laminating other thermoplastic resin layer on the EVOH film and/or forming a vapor deposition layer (i.e., film-breaking resistance), and to exhibit superior slidability between films in the case of their storage in the form of a film roll, and between a roll used in the production step and the EVOH film in their lamination processing (i.e., blocking resistance).

Furthermore, since vapor deposition defects such as pinholes generated in vapor deposition processing lead to deterioration of gas barrier performances (see Japanese Unexamined Patent Application, Publication No. 2005-290108), the inhibition of the generation of the vapor deposition defects and a time-dependent increase of the defects in the vapor deposition processing is required.

Moreover, in laminates including a vapor deposition layer, an increase of adhesive strength between the vapor deposition layer and the EVOH film, and the inhibition of delamination and the like which may cause unfavorable appearances are also required.

In order to address these requirements, a method has been proposed in which an acid such as carboxylic acid and phosphoric acid, and a metal salt such as an alkali metal salt and an alkaline earth metal are incorporated in an appropriate amount to prevent the occurrence of coloring such as yellowing in the melt molding (see Japanese Unexamined Patent Application, Publication No. 2001-146539). Alternatively, the incorporation of an oxide and a boron compound has been proposed to improve the slidability and the blocking resistance of a film (see Japanese Unexamined Patent Application, Publication No. 2000-265024). Furthermore, in order to inhibit the deterioration of the gas barrier performances due to pinholes generated in the vapor deposition processing, it has been proposed to use a multilayered structure including at least one layer obtained by subjecting a resin film for a surface treatment, which has a molar ratio of an oxygen atom to a carbon atom on the film surface of 0.24 or greater, to a treatment with aluminum metal or silicon oxide (see Japanese Unexamined Patent Application, Publication No. 2005-290108).

However, the method in which the acid and the metal salt are incorporated in an appropriate amount, which is disclosed in Japanese Unexamined Patent Application, Publication No. 2001-146539 described above cannot sufficiently inhibit the occurrence of coloring such as yellowing in the melt molding. Moreover, although the incorporation of the oxide and the boron compound as disclosed in Japanese Unexamined Patent Application, Publication No. 2000-265024 described above improves the slidability and the blocking resistance of the film, the inhibition of the generation of the pinholes in the vapor deposition processing and the lamination processability are unsatisfactory. Furthermore, in the multilayered structure disclosed in Japanese Unexamined Patent Application, Publication No. 2005-290108 described above, since the generation of the pinholes in the layer subjected to the treatment with the aluminum metal or silicon oxide has not been reduced, the deterioration of the barrier properties is concerned. Thus, the conventional resin compositions cannot satisfy the aforementioned requirements. In addition, an attention should be paid to an odor in molding from an environmental viewpoint.

PRIOR ART DOCUMENTS

Patent Documents

Patent Document 1: Japanese Unexamined Patent Application, Publication No. 2005-290108
Patent Document 2: Japanese Unexamined Patent Application, Publication No. 2001-146539
Patent Document 3: Japanese Unexamined Patent Application, Publication No. 2000-265024
Patent Document 4: Japanese Unexamined Patent Application, Publication No. 2002-310385

SUMMARY OF THE INVENTION

Problems to be Solved by the Invention

The present invention was made in view of the foregoing circumstances, and it is an object of the present invention to provide a resin composition that achieves superior appearance characteristics such as a color of a film end (or a roll end) after melt molding, film-breaking resistance, blocking resistance, vapor deposition defects-inhibiting properties, and adhesive strength of a vapor deposition layer.

Means for Solving the Problems

According to an aspect of the present invention made for solving the aforementioned problems, a resin composition contains: an ethylene-vinyl alcohol copolymer (hereinafter, may be also referred to as "EVOH (A)"); inorganic particles (hereinafter, may be also referred to as "inorganic particles (B)"); and an aliphatic carbonyl compound having 3 to 8 carbon atoms (hereinafter, may be also referred to as "aliphatic carbonyl compound (C)"), in which the content of the inorganic particles (B) is 50 ppm or greater and 5,000 ppm or less, the aliphatic carbonyl compound is at least one selected from the group consisting of a saturated aldehyde (hereinafter, may be also referred to as "saturated aldehyde (c-1)"), an unsaturated aldehyde (hereinafter, may be also referred to as "unsaturated aldehyde (c-2)") and a saturated ketone (hereinafter, may be also referred to as "saturated ketone (c-3)"), and the content of the aliphatic carbonyl compound (C) is 0.01 ppm or greater and 100 ppm or less.

Due to containing the EVOH (A), the inorganic particles (B) and the aliphatic carbonyl compound (C), with the inorganic particles (B) and the aliphatic carbonyl compound (C) being contained in a specific amount, the resin composition of the aspect of the present invention achieves superior appearance characteristics after melt molding, film-breaking resistance, vapor deposition defects-inhibiting properties, and adhesive strength of a vapor deposition layer. Although not necessarily clarified, the reason for achieving the effects is presumed, for example, as in the following. Specifically, due to the resin composition containing the specific amount of the inorganic particles (B) and the aliphatic carbonyl compound (C), an improvement of the blocking resistance and the slidability of the film surface owing to the inorganic particles (B), and the inhibition of the generation of gelatinous seeds (dirt under paint) and the like owing to the aliphatic carbonyl compound (C) would be each exerted. Moreover, the aliphatic carbonyl compound (C) would effectively interact with the surface of the inorganic particles (B), and allow the inorganic particles (B) to be dispersed in the resin composition, leading to an increase of the aforementioned effects of the inorganic particles (B). As a result, the appearance characteristics after melt molding, the film-breaking resistance, the vapor deposition defects-inhibiting properties, and the adhesive strength of a vapor deposition layer of the resin composition would be improved.

The mass ratio of the inorganic particles (B) to the aliphatic carbonyl compound (C) is preferably 1 or greater and 100,000 or less. When the mass ratio of the inorganic particles (B) to the aliphatic carbonyl compound (C) falls within the above range, it is considered that the inorganic particles (B) can be appropriately dispersed as described above, and more favorable ranges of an arithmetic average roughness (Ra) and an average length (RSm) of profile elements of the film surface can be achieved. As a result, the adhesive strength of a vapor deposition layer, and the film-breaking resistance of the resin composition can be more improved.

The mean particle diameter of the inorganic particles (B) is preferably 0.5 μm or greater and 10 μm or less. According to the resin composition, when the mean particle diameter of the inorganic particles (B) falls within the above range, a further favorable arithmetic average roughness (Ra) of the film surface can be achieved. As a result, the film-breaking resistance, the vapor deposition defects-inhibiting properties, and the adhesive strength of a vapor deposition layer can be further improved.

The inorganic particles (B) preferably contain a metal element which is at least one selected from the group consisting of silicon, aluminum, magnesium, zirconium, cerium, tungsten and molybdenum. Moreover, an inorganic substance composing the inorganic particles (B) is preferably an oxide of the element. According to the resin composition, when the above-specified inorganic particles (B) are contained, the appearance characteristics after melt molding and the like can be further improved.

The saturated aldehyde (c-1) is preferably a saturated aliphatic aldehyde, and more preferably at least one selected from the group consisting of propanal, butanal and hexanal. The unsaturated aldehyde (c-2) is preferably an unsaturated aliphatic aldehyde, and more preferably at least one selected from the group consisting of crotonaldehyde, 2,4-hexadienal and 2,4,6-octatrienal. According to the resin composition, when the saturated aldehyde (c-1) or the unsaturated aldehyde (c-2) is contained, the appearance characteristics after melt molding, the film-breaking resistance, the vapor deposition defects-inhibiting properties, and the adhesive strength of a vapor deposition layer can be more improved.

The saturated ketone (c-3) is preferably a saturated aliphatic ketone, and more preferably at least one selected from the group consisting of acetone, methyl ethyl ketone and 2-hexanone. When the saturated ketone (c-3) is contained, the appearance characteristics after melt molding, the film-breaking resistance, the vapor deposition defects-inhibiting properties, and the adhesive strength of a vapor deposition layer can be more improved.

According to another aspect of the present invention, a film is formed from the resin composition according to the aforementioned aspect of the present invention. Since the film is formed from the resin composition, the film is superior in appearance characteristics, film-breaking resistance and blocking resistance.

The arithmetic average roughness (Ra) of at least one surface of the film as determined in accordance with JIS B0601 is preferably 0.05 μm or greater and 1 μm or less. When the arithmetic average roughness (Ra) falls within the above range, the film is more superior in the film-breaking resistance.

Moreover, the average length (RSm) of the profile elements of at least one surface of the film as determined in accordance with JIS B0601 is preferably 50 μm or greater and 1,000 μm or less. When the average length (RSm) of the profile elements falls within the above-specified range, the film is further superior in the film-breaking resistance.

According to still another aspect of the present invention, a laminate includes a layer including the film, and at least one other layer constituted with other component.

Moreover, it is preferred that the other layer is a metal vapor deposition layer and the laminate includes two or more metal vapor deposition layers on one side or both sides of the film. When the two or more metal vapor deposition layers are vapor-deposited, an improvement and stability of the gas barrier properties can be achieved.

Moreover, the sum of the average thickness of the metal vapor deposition layer(s) on one side of the film is preferably 15 nm or greater and 150 nm or less. When the laminate includes the metal vapor-deposited film having the average thickness falling within the above-specified range, the laminate exhibits less vapor deposition defects, and superior adhesive strength between the metal vapor deposition layer and other resin layer.

According to yet still another aspect of the present invention, a packaging material includes the film or the laminate.

Due to including the film or the laminate described above, the packaging material is superior in appearance characteristics and film-breaking resistance.

According to even yet still another aspect of the present invention, a vacuum thermal insulator includes the laminate.

According to the vacuum thermal insulator, due to including the laminate described above, the generation of a crack in the metal vapor deposition layer and/or the peeling of the metal vapor deposition layer from the film is/are inhibited, and consequently the vacuum thermal insulator is superior in gas barrier properties.

According to even yet still another aspect of the present invention, a method for producing the film according to the another aspect of the present invention includes the step of cast-molding the resin composition according to the aspect of the present invention.

Moreover, according to even yet still another aspect of the present invention, another method for producing the film according to the another aspect of the present invention includes the step of stretching a film formed from the resin composition according to the aspect of the present invention.

According to the methods for producing the film, due to including the above step, a film more superior in appearance characteristics, film-breaking resistance and blocking resistance can be obtained.

According to even yet still another aspect of the present invention, a method for producing the laminate according to the still another aspect of the present invention includes the step of forming the vapor deposition layer on the film, in which the surface temperature of the film in the step of forming the vapor deposition layer is 60° C. or less. According to the production method, since the vapor deposition layer is formed at a comparatively low temperature, superior economical efficiency can be achieved, and deformation (for example, thermal expansion or warpage) of the film, and deterioration of surface characteristics of the film can be inhibited. Moreover, since the vapor deposition is carried out at a surface temperature of the film of 60° C. or less, the particle diameter of the particles constituting the vapor deposition layer can be decreased such that the mean particle diameter is 150 nm or less, for example, and therefore the generation of vapor deposition voids can be inhibited. Since the deformation of the film, the vapor deposition voids and the like are thus inhibited, a laminate can be provided in which the generation of defects such as a crack in the vapor deposition layer and/or the peeling of the vapor deposition layer from the film is/are inhibited.

The term "metal element" as referred to herein encompasses both transition metal elements and typical metal elements, including also metalloid elements as generally referred to, such as Si and Ge. Moreover, "ppm" means a mass ratio of a pertinent component in the resin composition, and 1 ppm means 0.0001% by mass.

Effects of the Invention

The resin composition of the aspect of the present invention achieves superior appearance characteristics such as a color of a film end (or a roll end) after melt molding, film-breaking resistance, blocking resistance, vapor deposition defects-inhibiting properties, and adhesive strength of a vapor deposition layer. The film according to the another aspect of the present invention is superior in appearance characteristics such as a color of a film end (for example, a roll end), film-breaking resistance and blocking resistance.

According to the method for producing the film of the even yet still another aspect of the present invention, a film more superior in appearance characteristics such as a color of a film end (for example, a roll end), film-breaking resistance and blocking resistance can be produced. The laminate according to still another aspect of the present invention exhibits less vapor deposition defects, and superior adhesive strength between the vapor deposition layer and the film or the like. The packaging material according to yet still another aspect of the present invention is superior in appearance characteristics and film-breaking resistance. The vacuum thermal insulator according to even yet still another aspect of the present invention is superior in gas barrier properties. Therefore, these can be suitably used as various packaging materials.

DESCRIPTION OF EMBODIMENTS

Hereinafter, embodiments of the present invention will be explained. However, the present invention is by no means limited to the following embodiments. In addition, with respect to materials exemplified in the following, one type of the materials may be used alone, or two or more types thereof may be used in combination, unless otherwise specified particularly.

Embodiments of the present invention involve a resin composition, a film, a laminate, a packaging material and a vacuum thermal insulator.

Resin Composition

The resin composition contains the EVOH (A), the inorganic particles (B), and the aliphatic carbonyl compound (C). The resin composition may contain optional component(s) within a range not leading to impairment of the effects of the present invention. Hereinafter, the EVOH (A), the inorganic particles (B), the aliphatic carbonyl compound (C) and the optional component(s) will be explained in detail.

EVOH (A)

The EVOH (A) is a copolymer obtained by saponifying a copolymer of ethylene and a vinyl ester. The vinyl ester is exemplified by vinyl acetate, vinyl propionate, vinyl pivalate, and the like, and vinyl acetate is preferred. The vinyl ester may be used either alone, or two or more types thereof may be used in combination. The EVOH (A) may include other structural unit derived from a monomer other than ethylene and vinyl ester. Such a monomer is exemplified by a vinylsilane compound, and other polymerizable compound. The content of the other structural unit is, for example, 0.0002 mol % or greater and 0.2 mol % or less with respect to the total structural units of the EVOH (A).

Examples of the vinylsilane compound include vinyltrimethoxysilane, vinyltriethoxysilane, vinyltri(B-methoxyethoxy)silane, y-methacryloxypropylmethoxysilane, and the like. Of these, vinyltrimethoxysilane and vinyltriethoxysilane are preferred.

Examples of the other polymerizable compound include:
unsaturated hydrocarbons such as propylene and butylene;
unsaturated carboxylic acids or esters thereof such as (meth)acrylic acid, methyl(meth)acrylate and ethyl(meth)acrylate;
vinylpyrrolidones such as N-vinylpyrrolidone; and the like.

The ethylene content of the EVOH (A) is typically 20 mol % or greater and 60 mol % or less, preferably 24 mol % or greater and 55 mol % or less, more preferably 27 mol % or greater and 45 mol % or less, still more preferably 27 mol % or greater and 42 mol % or less, and particularly preferably 27 mol % or greater and 38 mol % or less. When the ethylene content is less than 20 mol %, water resistance, hot water resistance and gas barrier properties under high humidity of a packaging material or the like obtained from the resin composition may be deteriorated, and melt formability may be impaired. On the other hand, when the ethylene content is greater than 60 mol %, gas barrier properties of a packaging material or the like obtained from the resin composition may be deteriorated.

The degree of saponification of the structural units derived from the vinyl ester in the EVOH (A) is typically 85% or greater, preferably 90% or greater, more preferably 98% or greater, and still more preferably 99% or greater. When the degree of saponification is less than 85%, insufficient thermal stability may be caused.

The content of the EVOH (A) in the resin composition is typically 95% by mass or greater, preferably 98.0% by mass or greater, more preferably 99.0% by mass, and still more preferably 99.5% by mass or greater. When the content of the EVOH (A) is 95% by mass or greater, advantageous characteristics of the EVOH can be sufficiently exhibited, and accordingly a molded article and the like obtained from the resin composition are superior in gas barrier properties, oil resistance, and the like.

The lower limit of the melt flow rate of the EVOH (A) is preferably 0.1 g/10 min, more preferably 0.5 g/10 min, still more preferably 1 g/10 min, and particularly preferably 3 g/10 min. The upper limit of the melt flow rate of the EVOH (A) is preferably 200 g/10 min, more preferably 50 g/10 min, still more preferably 30 g/10 min, and particularly preferably 15 g/10 min. When the melt flow rate of the EVOH (A) falls within the above range, the melt formability of the resulting resin composition may be improved, and consequently more superior appearance characteristics and long-run workability, i.e., the possibility that a molded article not accompanied by occurrences of any fish eye, streak, or the like can be obtained even if molding is carried out for long period of time, can be exhibited. It is to be noted that the melt flow rate is measured at a temperature of 210° C. under a load of 2,160 g in accordance with JIS K7210.

Inorganic Particles (B)

The resin composition of the embodiment of the present invention achieves an appropriate arithmetic average roughness (Ra) of the surface of the film formed from the resin composition, and improves blocking resistance and slidability. The inorganic particles as referred to herein mean particles constituted with an inorganic substance as a principal component. The principal component as referred to means the component contained in the greatest amount, and, for example, a component contained in an amount of 50% by mass or greater.

An inorganic substance composing the inorganic particles (B) is preferably at least one selected from the group consisting of silicon, aluminum, magnesium, zirconium, cerium, tungsten and molybdenum. Of these, at least one selected from the group consisting of silicon, aluminum and magnesium is more preferred in light of availability thereof. The inorganic substance is exemplified by oxides, nitrides, oxynitrides and the like of the exemplified elements, and oxides are preferred.

The lower limit of the mean particle diameter of the inorganic particles (B) is preferably 0.5 µm, more preferably 1.5 µm, and still more preferably 2.5 µm. The upper limit of the mean particle diameter of the inorganic particles (B) is preferably 10 µm, more preferably 8 µm, and still more preferably 5 µm. When the mean particle diameter of the inorganic particles (B) falls within the above range, an appropriate arithmetic average roughness (Ra) of the surface of the film formed from the resin composition can be achieved, and consequently the blocking resistance and the slidability can be improved. As a result, the resin composition can improve the film-breaking resistance, the vapor deposition defects-inhibiting properties, and the adhesive strength of a vapor deposition layer, and additionally, can more improve the adhesive strength of the film.

The lower limit of the content of the inorganic particles (B) is 50 ppm, preferably 100 ppm, and more preferably 150 ppm with respect to the resin composition. The upper limit of the content of the inorganic particles (B) is 5,000 ppm, preferably 4,000 ppm, and more preferably 3,000 ppm with respect to the resin composition. When the content of the inorganic particles (B) falls within the above range, an appropriate arithmetic average roughness (Ra) of the surface of the film formed from the resin composition can be achieved, and consequently the blocking resistance and the slidability can be improved. As a result, the resin composition can achieve superior film-breaking resistance and vapor deposition defects-inhibiting properties, and additionally, can improve the adhesive strength of the resulting film. One type, or two or more types of particles may be contained as the inorganic particles (B). Moreover, a single particle may be formed from one type, or two or more types of the inorganic substance.

Aliphatic Carbonyl Compound (C)

The aliphatic carbonyl compound (C) inhibits generation of gelatinous seeds (dirt under paint) and the like, and additionally improves the dispersibility of the inorganic particles (B) in the resin composition, leading to enhancement of the effects of the inorganic particles (B). The aliphatic carbonyl compound (C) is at least one selected from the group consisting of a saturated aldehyde (c-1), an unsaturated aldehyde (c-2) and a saturated ketone (c-3). In this regard, the content of the aliphatic carbonyl compound (C) in the resin composition as referred to is expressed as a ratio of the aliphatic carbonyl compound (C) to the mass of the total solid content of the resin composition, and specifically means a value obtained by a quantitative determination of the aliphatic carbonyl compound (C) contained in the dried resin composition.

Saturated Aldehyde (c-1)

The saturated aldehyde (c-1) as referred to means an aldehyde that does not include an unsaturated bond in a moiety other than the aldehyde group in its molecule. The saturated aldehyde (c-1) may be a linear aldehyde, a branched aldehyde, or an aldehyde having a ring structure in its molecule as long as the saturated aldehyde (c-1) does not include an unsaturated bond in the moiety other than the aldehyde group. The saturated aldehyde (c-1) may have one, or two or more aldehyde groups in its molecule.

The saturated aldehyde (c-1) is exemplified by a saturated aliphatic aldehyde and the like. Examples of the saturated aliphatic aldehyde include propanal, butanal, pentanal, hexanal, heptanal, octanal, cyclohexanecarbaldehyde, cyclopentylaldehyde, dimethylcyclohexanecarbaldehyde, methylcyclohexanecarbaldehyde, methylcyclopentylaldehyde, and the like.

The saturated aldehyde (c-1) preferably has 3 to 8 carbon atoms in light of an improvement of the solubility of the saturated aldehyde (c-1) in water. In light of the inhibition of the coloring and the generation of defects caused by melt molding, and an improvement of the long-run workability, the saturated aldehyde (c-1) is preferably a saturated aliphatic aldehyde, more preferably propanal, butanal or hexanal, and still more preferably propanal, among the saturated aldehydes exemplified.

A part or all of hydrogen atoms included in the saturated aldehyde (c-1) may be substituted with a substituent within a range not leading to impairment of the effects of the present invention. The substituent is exemplified by a halogen atom, a hydroxy group, an amino group, an amide group, a cyano group, and the like.

The lower limit of the content of the saturated aldehyde (c-1) in the resin composition is 0.01 ppm, preferably 0.05 ppm, more preferably 0.1 ppm, still more preferably 0.15 ppm, and particularly preferably 0.2 ppm. The upper limit of the content of the saturated aldehyde (c-1) is 100 ppm, preferably 95 ppm, more preferably 50 ppm, still more preferably 30 ppm, and particularly preferably 20 ppm. When the content of the saturated aldehyde (c-1) is less than the lower limit, the effects exerted by the incorporation of the saturated aldehyde (c-1), for example, the inhibition of the generation of gelatinous seeds (dirt under paint) and the like by the saturated aldehyde (c-1), and the effect of improving the dispersibility of the inorganic particles (B) by the saturated aldehyde (c-1) may not be satisfactorily exhibited. On the other hand, when the content of the saturated aldehyde (c-1) is greater than the upper limit, oxidization and/or crosslinking of the resin composition due to the saturated aldehyde (c-1) is/are likely to occur in melt molding.

Consequently, the generation of the gelatinous seeds (dirt under paint) may be induced, and the coloring of the resin composition is also likely to occur.

Unsaturated Aldehyde (c-2)

The unsaturated aldehyde (c-2) as referred to means an aldehyde that has a carbon-carbon double bond or a carbon-carbon triple bond in its molecule. The lower limit of the content of the unsaturated aldehyde (c-2) is 0.01 ppm, preferably 0.05 ppm, and more preferably 0.1 ppm with respect to the resin composition. On the other hand, the upper limit of the content of the unsaturated aldehyde (c-2) is 100 ppm, and preferably 50 ppm with respect to the resin composition. When the content of the unsaturated aldehyde (c-2) is less than the lower limit, the inhibition of a time-dependent increase of the generation of gels and/or seeds (dirt under paint) in the melt molding may be unsatisfactory. To the contrary, when the content of the unsaturated aldehyde (c-2) is greater than the upper limit, condensation between the unsaturated aldehydes and/or crosslinking of the EVOH with a condensate of the unsaturated aldehydes may occur in the melt molding, leading to an induction of the generation of the fish eyes and/or the streaks. Moreover, the coloring of the resin composition may easily occur.

Examples of the unsaturated aldehyde (c-2) include unsaturated aliphatic aldehydes, for example:

aldehydes having a carbon-carbon double bond in their molecule such as acrolein, crotonaldehyde, methacrolein, 2-methylbutenal, 2-hexenal, 2,6-nonadienal, 2,4-hexadienal, 2,4,6-octatrienal, 5-methyl-2-hexenal, cyclopentenylaldehyde and cyclohexenylaldehyde;

aldehydes having a carbon-carbon triple bond in their molecule such as propiolaldehyde, 2-butyn-1-al and 2-pentyn-1-al; and the like.

Of these, the unsaturated aldehyde (c-2) is preferably an unsaturated aliphatic aldehyde, more preferably an aldehyde having a carbon-carbon double bond in its molecule, and still more preferably crotonaldehyde, 2,4-hexadienal or 2,4,6-octatrienal. Among these, crotonaldehyde having a boiling point of about 100° C. and having a high solubility in water is particularly preferred because of ease in eliminating an excess, or supplying a shortage as needed in a washing step and/or a drying step, for example. The unsaturated aldehyde (c-2) has preferably 3 to 8 carbon atoms, more preferably 4 to 8 carbon atoms, and still more preferably 4, 6 or 8 carbon atoms, including the carbon atom of the aldehyde moiety.

Saturated Ketone (c-3)

The saturated ketone (c-3) inhibits the generation of gelatinous seeds (dirt under paint) and the like, and additionally improves the dispersibility of the inorganic particles (B) in the resin composition, whereby the effects of the inorganic particles (B) are enhanced. The saturated ketone (c-3) as referred to herein means a ketone that does not include an unsaturated bond in a moiety other than the carbonyl group in its molecule. The saturated ketone (c-3) may be a linear ketone, a branched ketone, or a ketone having a ring structure in its molecule as long as the saturated ketone (c-3) does not include an unsaturated bond in the moiety other than the carbonyl group. The saturated ketone (c-3) may have one, or two or more carbonyl groups in its molecule.

The saturated ketone (c-3) is exemplified by a saturated aliphatic ketone and a saturated cyclic ketone. Examples of the saturated aliphatic ketone include acetone, methyl ethyl ketone, 2-pentanone, 3-pentanone, 3-methyl-2-butanone, 2-hexanone, 3-hexanone, 4-methyl-2-pentanone, 2-methyl-3-pentanone, 3,3-dimethyl-2-butanone, 2-heptanone, 3-heptanone, 4-heptanone, 4-methyl-2-hexanone, 5-methyl-2-hexanone, 2,4-dimethyl-3-pentanone, 2-octanone, 3-methyl-2-heptanone, 5-methyl-3-heptanone, 3-octanone, 6-methyl-2-heptanone, 2,6-dimethyl-4-heptanone, methyl cyclopentyl ketone, methyl cyclohexyl ketone, ethyl cyclopentyl ketone, ethyl cyclohexyl ketone, and the like. Examples of the saturated cyclic ketone include cyclobutanone, cyclopentanone, cyclohexanone, cycloheptanone, cyclooctanone, and the like.

The saturated ketone (c-3) preferably has 3 to 8 carbon atoms in light of an improvement of the solubility of the saturated ketone (c-3) in water. In light of the inhibition of the coloring and the generation of defects caused by melt molding, and an improvement of the long-run workability, the saturated ketone (c-3) is preferably a saturated aliphatic ketone, more preferably acetone, methyl ethyl ketone or 2-hexanone, and still more preferably acetone, among the saturated ketones exemplified.

A part or all of hydrogen atoms included in the saturated ketone (c-3) may be substituted with a substituent within a range not leading to impairment of the effects of the present invention. The substituent is exemplified by a halogen atom, a hydroxy group, an amino group, an amide group, a cyano group, and the like.

The lower limit of the content of the saturated ketone (c-3) in the resin composition is 0.01 ppm, preferably 0.05 ppm, more preferably 0.1 ppm, still more preferably 0.15 ppm, and particularly preferably 0.2 ppm. The upper limit of the content of the saturated ketone (c-3) is 100 ppm, preferably 95 ppm, more preferably 50 ppm, still more preferably 30 ppm, and particularly preferably 20 ppm. When the content of the saturated ketone (c-3) is less than the lower limit, the effects exerted by the incorporation of the saturated ketone (c-3), for example, the inhibition of the generation of gelatinous seeds (dirt under paint) and the like by the saturated ketone (c-3), and the effect of improving the dispersibility of the inorganic particles (B) by the saturated ketone (c-3) may not be satisfactorily exhibited. On the other hand, when the content of the saturated ketone (c-3) is greater than the upper limit, oxidization and/or crosslinking of the resin composition due to the saturated ketone (c-3) is/are likely to occur in melt molding. Consequently, the generation of the gelatinous seeds (dirt under paint) may be induced, and the coloring of the resin composition is also likely to occur.

The lower limit of the mass ratio ((B)/(C)) of the inorganic particles (B) to the aliphatic carbonyl compound (C) is preferably 0.5, more preferably 1, still more preferably 50, and particularly preferably 100. Moreover, the upper limit of the mass ratio is preferably 100,000, more preferably 10,000, still more preferably 5,000, and particularly preferably 1,000. When the mass ratio of the inorganic particles (B) to the aliphatic carbonyl compound (C) falls within the above range, an appropriate arithmetic average roughness (Ra) of the surface of the film formed from the resin composition as determined in accordance with JIS B0601 and an appropriate average length (RSm) of the profile elements as determined in accordance with JIS B0601 may be achieved, and consequently the blocking resistance and/or the slidability may be further improved. As a result, the film-breaking resistance of the resin composition may be further improved, and the adhesive strength after the metal vapor deposition can be further improved.

Optional Component

The resin composition may contain an optional component within a range not leading to impairment of the effects of the present invention. Examples of the optional component include a carboxylic acid and an ion thereof, a metal ion, a phosphorus compound, a boron compound, a conjugated polyene compound, other additive, and the like. The resin composition may contain two or more types of these optional components, and the total content of the optional component is preferably 1% by mass or less with respect to the resin composition.

Carboxylic Acid and Ion Thereof

The carboxylic acid and the ion thereof improve coloring resistance of the resin composition in the melt molding.

The carboxylic acid has one or more carboxyl group and one or less carbon-carbon double bond in its molecule. The carboxylic acid ion is derived from the carboxylic acid by elimination of the hydrogen ion of a carboxyl group in the carboxylic acid. The carboxylic acid contained in the resin composition may be a monocarboxylic acid, a polyhydric carboxylic acid compound having two or more carboxyl groups in its molecule, or a combination thereof. It is to be noted that the polyhydric carboxylic acid excludes a polymer. A polyhydric carboxylic acid ion is derived from the polyhydric carboxylic acid by elimination of the hydrogen ion of at least one carboxyl group of the polyhydric carboxylic acid. The carboxylic acid ion may form a salt together with the metal ion.

The monocarboxylic acid is not particularly limited, and examples thereof include formic acid, acetic acid, propionic acid, butyric acid, caproic acid, capric acid, acrylic acid, methacrylic acid, and the like. These carboxylic acids may have a hydroxyl group and/or a halogen atom. Moreover, examples of the carboxylic acid ion include ions formed from the carboxylic acid after elimination of the hydrogen ion of the carboxyl group of the carboxylic acid, and the like. In light of pH-adjustability and melt formability of the resin composition, the pKa of the monocarboxylic acid (including the polyhydric carboxylic acid giving a monocarboxylic acid ion) is preferably 3.5 or greater, and more preferably 4 or greater. Examples of the monocarboxylic acid include formic acid (pKa=3.68), acetic acid (pKa=4.74), propionic acid (pKa=4.85), butyric acid (pKa=4.80), and the like, and acetic acid is preferred in light of the handleability thereof.

The upper limit of the content of the carboxylic acid and the carboxylic acid ion is preferably 20 μmol/g in terms of carboxylate radical equivalent in light of the coloring resistance in the melt molding. On the other hand, the lower limit of the aforementioned content is preferably 0.01 μmol/g in terms of carboxylate radical equivalent.

Metal Ion

The metal ion improves interlayer adhesiveness when a packaging material or the like is molded. In the case of molding the packaging material or the like, when the resin composition contains the metal ion, the interlayer adhesiveness of the packaging material or the like can be improved, and consequently the durability of the packaging material or the like can be improved. Although not necessarily clarified, the reason for the improvement of the interlayer adhesiveness by the metal ion is presumed as in the following. Specifically, in a case where one of adjacent layers has, in its molecule, a functional group capable of reacting with a hydroxyl group of the EVOH (A), etc., a bond-forming reaction between the hydroxyl group and the functional group would be accelerated owing to the presence of the metal ion, etc.

The metal ion is exemplified by an alkali metal ion, an alkaline earth metal ion, and the like. These metal ions may be used either alone, or two or more types thereof may be used in combination.

The metal ion is preferably an alkali metal ion. Examples of the alkali metal ion include ions of lithium, sodium, potassium, rubidium, cesium and the like, and a sodium ion and a potassium ion are preferred in light of their availability on an industrial scale. Moreover, an alkaline earth metal ion is also preferred as the metal ion. Examples of the alkaline earth metal ion include ions of beryllium, magnesium, calcium, strontium, barium and the like, and a magnesium ion and a calcium ion are preferred in light of their availability on an industrial scale. When the resin composition contains the alkali metal ion, the long-run workability in the melt molding as well as the interlayer adhesive force in the resulting packaging material or the like can be improved. When the metal ion is the alkaline earth metal ion, the deterioration of the formed packaging material or the like after repeated use thereof can be inhibited, and additionally the defects such as gelatinous seeds (dirt under paint) can be reduced, leading to an improvement of the appearance of the molded article.

A compound containing the metal ion is not particularly limited, and examples thereof include: alkali metal salts such as the carboxylic acid salt described above, an aromatic carboxylic acid salt and the like of lithium, sodium, potassium, and the like; metal complexes; and the like. Examples of the alkali metal salt include sodium acetate, potassium acetate, sodium stearate, potassium stearate, sodium salts of ethylenediaminetetraacetic acid, and the like. Of these, sodium acetate and potassium acetate are preferred in light of their availability. The lower limit of the content (the content in a dry resin composition) of the metal ion is preferably 2.5 μmol/g. The upper limit of the content of the metal ion is preferably 22 μmol/g.

Phosphorus Compound

The phosphorus compound inhibits the coloring and the generation of defects such as streaks and fish eyes, and additionally improves the long-run workability. Examples of the phosphorus compound include various types of phosphoric acids such as phosphoric acid and phosphorous acid, phosphate and the like. The phosphate may be in any form of a monobasic phosphate salt, a dibasic phosphate salt and a tribasic phosphate salt. In addition, the cationic species contained in the phosphate is not particularly limited, and the phosphate is preferably a salt containing the alkali metal ion or the alkaline earth metal ion among the aforementioned metal ions. Of these, sodium dihydrogen phosphate, potassium dihydrogen phosphate, disodium hydrogen phosphate and dipotassium hydrogen phosphate are more preferred, and sodium dihydrogen phosphate and dipotassium hydrogen phosphate are still more preferred. The lower limit of the content of the phosphorus compound in the resin composition (the content in terms of phosphate radical equivalent in a dry resin composition) is preferably 1 ppm. The upper limit of the content of the phosphorus compound is preferably 200 ppm.

Boron Compound

The boron compound inhibits gelation in the melt molding, and additionally inhibits a torque fluctuation of an extrusion molding machine or the like, i.e., a variation of a viscosity during heating. Examples of the boron compound include: boric acids such as orthoboric acid, metaboric acid and tetraboric acid; boric acid esters such as triethyl borate and trimethyl borate; boric acid salts such as salts of the aforementioned boric acids which contain an alkali metal ion or an alkaline earth metal ion among the aforementioned metal ions, and borax; and boron hydrides; and the like. Of these, boric acids are preferred, and orthoboric acid (hereinafter, may be also referred to as "boric acid") is more preferred. The lower limit of the content of the boron compound in the resin composition is preferably 100 ppm. The upper limit of the content of the boron compound is preferably 5,000 ppm. It is to be noted that the content of the boron compound means that of the boron compound in a dry resin composition in terms of boron element equivalent.

Conjugated Polyene Compound

The conjugated polyene compound inhibits oxidative degradation in melt molding. The conjugated polyene compound as referred to herein means a compound having a conjugated double bond, as generally referred to, i.e., having two or more carbon-carbon double bonds and having a structure in which a carbon-carbon double bond and a carbon-carbon single bond are alternately connected, and the conjugated polyene compound can bond to an atom or a functional group selected from the group consisting of a hydrogen atom, a halogen atom, a hydroxyl group, an ester group, a carboxyl group or a metal salt of a carboxyl group. The conjugated polyene compound may be a conjugated diene including two double bonds involved in the conjugation, a conjugated triene including three double bonds involved in the conjugation, or a conjugated polyene including four or more double bonds involved in the conjugation. In addition, the conjugated double bond may be present in a plurality of number in a single molecule without being conjugated with one another. For example, compounds having three conjugated triene structures in the same molecule, such as tung oil, may also be included in the conjugated polyene compound.

The conjugated polyene compound preferably has 7 or less conjugated double bonds. When the resin composition contains a conjugated polyene compound having 8 or more conjugated double bond, coloring of molded articles is likely to occur. The conjugated polyene compound may include, in addition to the conjugated double bond, other functional group such as a carboxyl group and a salt thereof (for example, a salt containing the aforementioned metal ion), a hydroxyl group, an ester group, an ether group, an amino group, an imino group, an amide group, a cyano group, a diazo group, a nitro group, a sulfone group and a salt thereof, a sulfonyl group, a sulfoxide group, a sulfide group, a thiol group, a phosphoric acid group and a salt thereof, a phenyl group, a halogen atom (for example, a fluorine atom, a chlorine atom, a bromine atom and an iodine atom), a double bond, and/or a triple bond.

One type of the conjugated polyene compound may be used alone, or two or more types thereof may be used in combination. The conjugated polyene compound has preferably 4 to 30 carbon atoms, and more preferably 4 to 10 carbon atoms. The conjugated polyene compound is preferably an aliphatic conjugated polyene carboxylic acid or a salt thereof, myrcene, or a mixture of two or more of these, and more preferably sorbic acid, sorbic acid salt (sodium sorbate, potassium sorbate, and the like), or a mixture thereof. Sorbic acid, sorbic acid salts and a mixture thereof exhibit superior suppressive effects on oxidative degradation at high temperatures and gel formation of the resin composition, and are preferred also in light of hygienic properties and availability since they are industrially used broadly also as food additives. Typically, the molecular weight of the conjugated polyene compound is preferably 1,000 or less. When the molecular weight of the conjugated polyene compound is greater than 1,000, the state of dispersion of the conjugated polyene compound in the EVOH (A) may be inferior, and the appearance after the melt molding may be unfavorable. The lower limit of the content of the conjugated polyene compound in the resin composition is preferably 0.01 ppm, whereas the upper limit of the content is preferably 1,000 ppm.

Other Additive, etc.

An appropriate amount of an antioxidant, an UV absorbent, a plasticizer, an antistatic agent, a lubricant, a colorant, a filler, a heat stabilizer, a desiccant, a crosslinking agent, a reinforcing agent such as various types of fibers, and the like may be added to the resin composition of the embodiment of the present invention, within a range not leading to impairment of the effects of the present invention.

Examples of the antioxidant include 2,5-di-t-butylhydroquinone, 2,6-di-t-butyl-p-cresol, 4,4'-thiobis(6-t-butylphenol), 2,2'-methylene-bis(4-methyl-6-t-butylphenol), octadecyl 3-(3',5'-di-t-butyl-4'-hydroxyphenyl)propionate, and the like.

Examples of the UV absorbent include ethylene 2-cyano-3,3'-diphenylacrylate, 2-(2'-hydroxy-5'-methylphenyl)benzotriazole, 2-(2'-hydroxy-5'-methylphenyl)benzotriazole, 2-(2'-hydroxy-5'-methylphenyl)benzotriazole, 2-(2'-hydroxy-3'-t-butyl-5'-methylphenyl)-5-chlorobenzotriazole, 2-hydroxy-4-methoxybenzophenone, 2,2'-dihydroxy-4-methoxybenzophenone, 2-hydroxy-4-octoxybenzophenone, and the like.

Examples of the plasticizer include dimethyl phthalate, diethyl phthalate, dioctyl phthalate, waxes, liquid paraffins, phosphoric acid esters, and the like.

Examples of the antistatic agent include pentaerythritol monostearate, sorbitan monopalmitate, sulfated polyolefins, polyethylene oxides, polyethylene glycols (trade name: Carbowax), and the like.

Examples of the lubricant include ethylene bisstearamide, butyl stearate, and the like.

Examples of the colorant include carbon black, phthalocyanine, quinacridone, indoline, azo pigments, colcothar, and the like.

Examples of the filler include glass fibers, wollastonite, calcium silicate, talc, montmorillonite, and the like.

Examples of the heat stabilizer include hindered phenol compounds, hindered amine compounds, and the like.

Moreover, a thermoplastic resin other than the EVOH (A) may be blend in an appropriate amount within a range not leading to impairment of the effects of the present invention. Examples of the thermoplastic resin other than the EVOH (A) include: various types of polyolefins such as polyethylenes, polypropylenes, poly(1-butene)s, ethylene-propylene copolymers, copolymers of ethylene and an α-olefin having 4 or more carbon atoms, and polyolefins modified with maleic anhydride; ethylene-vinyl ester copolymers; ethylene-acrylic acid ester copolymers; various types of nylons; polyesters; polyacrylonitriles; modified polyvinyl alcohol resins; and the like. When the thermoplastic resin other than the EVOH (A) is contained, the content thereof is preferably 50% by mass or less, and more preferably 10% by mass or less with respect to the resin composition.

The lower limit of the melt flow rate of the resin composition is preferably 0.1 g/10 min, more preferably 0.5 g/10 min, still more preferably 1 g/10 min, and particularly preferably 3 g/10 min. The upper limit of the melt flow rate of the resin composition is preferably 200 g/10 min, more preferably 50 g/10 min, still more preferably 30 g/10 min, particularly preferably 15 g/10 min, and most preferably 10 g/10 min. When the melt flow rate of the resin composition falls within the above range, the melt formability may be improved, and consequently more superior appearance characteristics and long-run workability can be exhibited. It is to be noted that the melt flow rate is measured at a temperature of 210° C. under a load of 2,160 g in accordance with JIS K7210.

Production Method of Resin Composition

The production method of the resin composition is not particularly limited as long as the EVOH (A), the inorganic particles (B) and the aliphatic carbonyl compound (C) can be homogeneously blended.

In a method for producing an ethylene-vinyl alcohol copolymer including, for example:

(1) copolymerizing ethylene with vinyl ester; and (2) saponifying the copolymer obtained in the step (1), the procedure for homogeneously blending the inorganic particles (B) and the aliphatic carbonyl compound (C) into the resin composition in the specified content may be exemplified by the following:

a procedure in which a specific amount of either the inorganic particles (B) or the aliphatic carbonyl compound (C), or both thereof is/are added in the step (1);

a procedure in which a specific amount of either the inorganic particles (B) or the aliphatic carbonyl compound (C), or both thereof is/are added in the step (2);

a procedure in which a specific amount of either the inorganic particles (B) or the aliphatic carbonyl compound (C), or both thereof is/are added to the EVOH obtained in the step (2);

a procedure in which a specific amount of either the inorganic particles (B) or the aliphatic carbonyl compound (C), or both thereof is/are added in melt-molding the EVOH obtained in the step (2);

a procedure in which the aforementioned procedures are employed in combination; and the like.

It is to be noted that when the procedure in which a specific amount of either the inorganic particles (B) or the aliphatic carbonyl compound (C), or both thereof is/are added in the step (1), or the procedure in which a specific amount of either the inorganic particles (B) or the aliphatic carbonyl compound (C), or both thereof is/are added in the step (2) is employed, it is necessary to add the specific amount of either the inorganic particles (B) or the aliphatic carbonyl compound (C), or both thereof within a range not leading to inhibition of the polymerization reaction in the step (1) or the saponification reaction in the step (2).

Of these procedures, in light of the ease of regulating the content of the inorganic particles (B) and the aliphatic carbonyl compound (C) in the resin composition, the procedure in which a specific amount of either the inorganic particles (B) or the aliphatic carbonyl compound (C), or both thereof is/are added to the EVOH obtained in the step (2), and the procedure in which a specific amount of either the inorganic particles (B) or the aliphatic carbonyl compound (C), or both thereof is/are added in melt-molding the EVOH obtained in the step (2) are preferred, and the procedure in which a specific amount of either the inorganic particles (B) or the aliphatic carbonyl compound (C), or both thereof is/are added to the EVOH obtained in the step (2) is more preferred.

The procedure for adding a specific amount of the inorganic particles (B) and the aliphatic carbonyl compound (C) to the EVOH is exemplified by:

a procedure in which pelletizing is carried out after blending either the inorganic particles (B) or the aliphatic carbonyl compound (C), or both thereof with the EVOH beforehand to give pellets;

a procedure in which a strand obtained by deposition of a paste after the saponification of the ethylene-vinyl ester copolymer is impregnated with the aliphatic carbonyl compound (C);

a procedure in which a strand obtained by deposition is impregnated with the aliphatic carbonyl compound (C) after cutting the strand;

a procedure in which either the inorganic particles (B) or the aliphatic carbonyl compound (C), or both thereof is/are added to a solution of redissolved chips of a dry resin composition;

a procedure in which a blend of two or three components of the EVOH as well as either the inorganic particles (B) or the aliphatic carbonyl compound (C), or both thereof is/are melt-kneaded;

a procedure in which either the inorganic particles (B) or the aliphatic carbonyl compound (C), or both thereof is/are fed to be contained in a melt of the EVOH during extrusion;

a procedure in which a masterbatch is produced by blending a high concentration of either the inorganic particles (B) or the aliphatic carbonyl compound (C), or both thereof with a part of the EVOH and pelletizing the blend, then the masterbatch is dry-blended with the EVOH, and thereafter the mixture is melt-kneaded; and the like.

Of these, in light of capability of more homogenously dispersing specific inorganic particles (B) and aliphatic carbonyl compound (C) in the EVOH, the procedure in which pelletizing is carried out after blending either the inorganic particles (B) or the aliphatic carbonyl compound (C), or both thereof with the EVOH beforehand to give pellets is preferred. Specifically, either the inorganic particles (B) or the aliphatic carbonyl compound (C), or both thereof is/are added to a solution prepared by dissolving the EVOH in a good solvent such as a mixed solvent of water and methanol, and the resulting mixture solution is extruded into a poor solvent through a nozzle or the like to permit deposition and/or coagulation, followed by washing and/or drying the same, whereby the pellets including the inorganic particles (B) and the aliphatic carbonyl compound (C) homogeneously mixed with the EVOH can be obtained.

The procedure for incorporating a component other than the inorganic particles (B) and the aliphatic carbonyl compound (C) into the resin composition may be exemplified by:

mixing the pellets with each component, followed by melt-kneading;

mixing the other component together with the inorganic particles (B) and the aliphatic carbonyl compound (C) in preparing the pellets;

immersing the pellets in a solution containing each component; and the like. It is to be noted that a ribbon blender, a high speed mixer, a cokneader, a mixing roll, an extruder, an intensive mixer and the like may be employed for mixing the pellets with the other component.

Molded Article

The resin composition is formed into various types of molded articles such as films, sheets, containers, pipes, fibers through melt-molding and the like. The films as referred to mean molded articles typically having a thickness of less than 300 μm, and the sheets as referred to mean molded articles typically having a thickness of 300 μm or greater. Examples of the melt-molding process include extrusion molding, cast molding, inflation extrusion molding, blow molding, melt spinning, injection molding, injection blow molding, and the like. The melt-molding temperature may vary in accordance with the melting point of the EVOH (A), and the lie, but is preferably about 150° C. to 270° C. Since the molded article is formed from the resin composition described above, the molded article is superior in appearance characteristics. The molded article can be ground and molded again for the purpose of recycling. In addition, the films, the sheets, the fibers and the like may be uniaxially or biaxially stretched. The molded article obtained through the melt-molding or the like may be subjected to secondary processing or forming such as bending processing, vacuum forming, blow molding and press molding, as needed, to obtain an intended molded article.

Film

The film according to another embodiment of the present invention is formed from the resin composition. Since the film is formed from the resin composition, the film is superior in appearance characteristics and film-breaking resistance. Examples of the film include monolayer films and multilayer films.

The upper limit of the arithmetic average roughness (Ra) of at least one surface of the film as determined in accordance with JIS B0601 is preferably 1.0 μm, more preferably 0.8 μm, still more preferably 0.6 μm, and particularly preferably 0.4 μm. The lower limit of the arithmetic average roughness (Ra) of at least one surface of the film is preferably 0.05 μm, more preferably 0.10 μm, still more preferably 0.15 μm, and particularly preferably 0.20 μm. When the arithmetic average roughness (Ra) of at least one surface of the film falls within the above range, more superior film-breaking resistance may be achieved.

The upper limit of the average length (RSm) of profile elements of at least one surface of the film as determined in accordance with JIS B0601 is preferably 1,000 μm, more preferably 800 μm, still more preferably 600 μm, and particularly preferably 400 μm. The lower limit of the average length (RSm) of the profile elements of at least one surface of the film is preferably 50 μm, more preferably 100 μm, still more preferably 150 μm, and particularly preferably 200 μm. When the average length (RSm) of the profile elements of at least one surface of the film falls within the above range, more superior film-breaking resistance may be achieved. The aforementioned JIS B0601 means JIS B0601: 2001, for example.

Production Method of the Film

The film can be produced according to a method similar to those exemplified in connection with the method for producing the molded article as described above. Of these, a method including the cast molding step of melt-extruding the resin composition onto a casting roll, and the step of stretching an unstretched film obtained from the resin composition (a uniaxially stretching step, a sequentially biaxial step, a simultaneously biaxially stretching step, or an inflation molding step) is preferred. According to the method for producing the film, since these steps are included, the film-breaking resistance can be improved.

Laminate

The molded article may be a molded article having a monolayer structure constituted only with a barrier layer (hereinafter, may be also referred to as "barrier layer") formed from the resin composition. However, the molded article is preferably a laminate which has on at least one side of the barrier layer, at least one layer constituted with other component in light of an improvement of functions thereof. Since the molded article includes the barrier layer or laminate formed from the resin composition exhibiting the properties described above, the molded article can be suitably used for boiling sterilization or retort sterilization.

The laminate is exemplified by a multilayer sheet, a multilayer pipe, a multilayer hose, a multilayer fiber, and the like. The other layer is preferably, for example, a thermoplastic resin layer formed from a thermoplastic resin. When the laminate includes the barrier layer and the thermoplastic resin layer, the laminate is superior in appearance characteristics, retort resistance and processing characteristics. Although the layer structure of the laminate according to this embodiment of the present invention is not particularly limited, examples thereof include structures such as T/E/T, E/Ad/T and T/Ad/E/Ad/T, wherein E stands for a layer constituted with the barrier layer or the laminate, Ad stands for a layer obtained from an adhesive resin, and T stands for a layer obtained from a thermoplastic resin. Each layer of these structures may be a monolayer or a multilayer.

The method for producing the laminate is not particularly limited. The method is exemplified by: a method that involves melt-extruding the thermoplastic resin onto the molded article (film, sheet, etc.) obtained from the resin composition; a method that involves coextruding the resin composition and other thermoplastic resin; a method that involves coinjecting the resin composition and the thermoplastic resin; a method that involves laminating the barrier layer or laminate obtained from the resin composition on a film, a sheet or the like having other base using a well-known adhesive such as an organic titanium compound, an isocyanate compound and a polyester compound; and the like.

Examples of the thermoplastic resin include homopolymers or copolymers of an olefin such as linear low density polyethylenes, low density polyethylenes, medium density polyethylenes, high density polyethylenes, ethylene-vinyl acetate copolymers, ethylene-propylene copolymers, polypropylenes, copolymers of propylene and an α-olefin (α-olefin having 4 to 20 carbon atoms), polybutenes and polypentenes; polyesters such as polyethylene terephthalate; polyester elastomers; polyamides such as nylon-6 and nylon-66; polystyrenes; polyvinyl chlorides; polyvinylidene chlorides; acrylic resins; vinyl ester-based resins; polyurethane elastomers; polycarbonates; chlorinated polyethylenes; chlorinated polypropylenes; and the like. Of these, polypropylenes, polyethylenes, ethylene-propylene copolymers, ethylene-vinyl acetate copolymers, polyamides, polystyrenes or polyesters are preferably used.

Although the adhesive resin is not particularly limited as long as the adhesive resin exhibits adhesiveness to the resin composition and the thermoplastic resin, an adhesive resin containing carboxylic acid-modified polyolefin is preferred.

A carboxyl group-containing, modified olefin-derived polymer obtained by chemically binding an ethylenically unsaturated carboxylic acid, or an ester or anhydride thereof to an olefin-derived polymer can be suitably used as the carboxylic acid-modified polyolefin. The olefin-derived polymer as referred to herein means polyolefin such as polyethylene, linear low density polyethylene, polypropylene and polybutene, or a copolymer of an olefin and other monomer. Of these, linear low density polyethylene, an ethylene-vinyl acetate copolymer, and an ethylene-acrylic acid ethyl ester copolymer are preferred, and linear low density polyethylene and an ethylene-vinyl acetate copolymer are particularly preferred.

The method for the coextrusion of the resin composition and the thermoplastic resin and the like is not particularly limited, and examples thereof include a multi-manifold-merging T-die method, a feedblock-merging T-die method, an inflation molding, and the like.

Alternatively, the laminate can be formed by providing on at least one surface of the film described above, at least one other layer constituted with other component, in which the other layer is a metal vapor deposition layer. Moreover, the laminate may include two or more metal vapor deposition layers described above on one side or both sides of the film. In addition, other resin layer may be laminated on the surface on the vapor deposition layer side and/or the other side. When the laminate has such a structure, gas barrier properties and moisture-proof properties can be enhanced. Moreover, although the metal vapor deposition layer may be laminated on both sides of the film, or on only one side of the film, the metal vapor deposition layer is more preferably laminated on both sides of the film. When the metal vapor deposition layer is laminated on both sides of the film, the gas barrier properties may be more improved, and gas barrier stability may be achieved. Specifically, even if a defect is generated on the metal vapor deposition layer on one side due to a physical impact or the like, the metal vapor deposition layer on the other side will maintain the barrier properties, whereby the gas barrier properties for use as the laminate will be suitably maintained. Moreover, since the resulting laminate includes the film formed from the resin composition described above, the resulting laminate has less vapor deposition defects and exhibits superior adhesive strength between the vapor deposition layer and the EVOH film layer.

A substance for forming the metal vapor deposition layer is exemplified by: a metal such as aluminum, zinc, magnesium and tin; an oxide of a metal or a metalloid such as silica, alumina and magnesia; and the like. Of these, in light of the gas barrier properties and moisture-proof property as well as the ease of vapor deposition processing, a metal is preferred, and aluminum is more preferred.

The average thickness of the metal vapor deposition layer on one side of the film is preferably 160 nm or less, more preferably 150 nm or less, still more preferably 130 nm or less, and particularly preferably 100 nm or less. The average thickness of the metal vapor deposition layer on one side of the film is preferably 15 nm or greater, more preferably 20 nm or greater, and still more preferably 30 nm or greater. When the average thickness of the metal vapor deposition layer on one side of the film is greater than 160 nm, a thermal bridge is likely to be generated in a vacuum thermal insulator, and consequently a thermal insulation effect may be deteriorated. On the other hand, when the average thickness of the metal vapor deposition layer on one side of the film is less than 15 nm, insufficient gas barrier properties may be caused. It is to be noted that the average thickness of the metal vapor deposition layer on one side of the film as referred to means an average of values of the thickness of the metal vapor deposition layer as determined using an electron microscope at arbitrary 10 points in cross section of the metal vapor deposition layer. In the case of a vapor-deposited film having a plurality of metal vapor deposition layers, the sum of the thickness of the metal vapor deposition layers on one side of the film (i.e., the sum of the average thickness of the metal vapor deposition layer) preferably falls within the range of the average thickness of the metal vapor deposition layer described above.

Although the lower limit of the mean particle diameter of the vapor-deposited particles such as aluminum particles in the metal vapor deposition layer is not particularly limited, the lower limit of the mean particle diameter of the vapor-deposited particles is preferably 10 nm, more preferably 15 nm, and still more preferably 20 nm. The upper limit of the mean particle diameter of the vapor-deposited particles is preferably 150 nm, more preferably 125 nm, still more preferably 100 nm, particularly preferably 75 nm, and most preferably 50 nm.

In this regard, the mean particle diameter of the vapor-deposited particles means an average obtained by dividing the sum of the maximum diameter of a plurality of vapor-deposited particles found along a single direction (maximum diameter along a single direction) in the observation of the surface of the vapor deposition layer using a scanning electron microscope, by the number of the particles found. In addition, in a case where the vapor-deposited particles form agglomerates, the mean particle diameter means the particle diameter (primary particle diameter) of vapor-deposited particles that constitute the agglomerates.

Production Method of Laminate

In the case of forming the metal vapor deposition layer on the film, when any of the following conditions is satisfied, a metal vapor deposition layer can be formed in which the mean particle diameter of the vapor-deposited particles is 150 nm or less.

(1) The surface temperature of the film is adjusted to 60° C. or less in the vapor deposition;

(2) the content of volatile matter contained in the film before the vapor deposition is adjusted to 1.1% by mass or less; and (3) the surface of the film before the vapor deposition is modified by a plasma treatment.

In regard to these methods, it is preferred that the condition (1) is satisfied, and it is more preferred that at least one of the condition (2) and the condition (3) is further satisfied in addition to the condition (1).

The surface temperature of the film in the metal vapor deposition is adjusted to preferably 60° C. or less, as described above, more preferably 55° C. or less, and still more preferably 50° C. or less. In addition, the lower limit of the surface temperature of the film in the vapor deposition is not particularly limited, but is preferably 0° C., more preferably 10° C., and still more preferably 20° C.

The lower limit of the content of volatile matter contained in the film before the vapor deposition is not particularly limited, but is preferably 0.01% by mass, more preferably 0.03% by mass, and still more preferably 0.05% by mass. The upper limit of the content of the volatile matter is preferably 1.1% by mass, more preferably 0.5% by mass, and still more preferably 0.3% by mass. In this regard, the content of the volatile matter is determined on the basis of a difference of the mass between before and after drying at 105° C. for 3 hours, according to an equation similar to the equation for determining the content of the volatile matter of the laminate (vapor-deposited film).

As the method for plasma-treating the surface of the film before the vapor deposition, a well-known method may be employed, but an atmospheric-pressure plasma treatment is preferred. A discharge gas in the atmospheric-pressure plasma treatment is exemplified by a nitrogen gas, helium, neon, argon, krypton, xenon, radon, and the like. Of these, nitrogen, helium and argon are preferred, and nitrogen is more preferred in light of a cost reduction.

Resin-Coating Layer

The resin-coating layer inhibits a damage of the vapor deposition layer due to bending, etc. in a step following the production of the laminate, e.g., film processing such as a lamination. The laminate having such a resin-coating layer exhibits inhibited deterioration of the gas barrier properties. The resin-coating layer contains the vinyl alcohol polymer, and may contain swelling inorganic layered silicate as needed. The lower limit of the average thickness of the resin-coating layer is not particularly limited, but is preferably 0.001 µm for achieving effective gas barrier properties. The upper limit of the average thickness of the resin-coating layer is not particularly limited, but is preferably 10 µm. Although the method for laminating the resin-coating layer on the metal vapor deposition layer is not particularly limited, a coating method and a lamination are preferred. Examples of the coating method include: a direct gravure method; a reverse gravure method; a micro gravure method; roll coating methods such as a two-roll bead coating method and a bottom feed three-roll reverse coating method; a doctor knife method; a die coating method; dip coating method; bar coating method; a combination thereof; and the like. Moreover, an interface between the metal vapor deposition layer and the resin-coating layer may have been subjected to e.g., a corona treatment, or a treatment with an anchor coating agent or the like.

Packaging Material

The vapor-deposited film which is the film or laminate obtained as in the foregoing (hereinafter, may be also merely referred to as "laminate") can be used as a packaging material. A packaging material (film, sheet, tube, bottle, deep draw container, cup-shaped container, etc.) may be obtained by further subjecting the film or laminate to secondary processing. Examples of the packaging material obtained after the secondary processing include:

(1) costretched multilayer sheets or films obtained by stretching the film and laminate in a uniaxial or biaxial direction, followed by a heat treatment;

(2) rolled multilayer sheets or films obtained by rolling the film or laminate;

(3) multilayer tray cup-shaped containers obtained by subjecting the film or laminate to a hot forming process such as vacuum forming, air-pressure forming, or vacuum air-pressure forming;

(4) bottles, cup-shaped containers and the like obtained by stretch blow molding or the like of the laminate. The secondary processing is not limited to the processes exemplified above, and any well-known secondary processing other than the aforementioned processes such as e.g., blow molding, as appropriate. Since the laminate includes the layer obtained from the resin composition that is superior in appearance characteristics and long-run workability, the laminate is accompanied by less fish eyes and streaks, and less coloring such as yellowing.

Spout Pouch

The spout pouch is used for packaging liquid substances, e.g., liquid beverages such as soft drinks, jelly beverages, yogurt, fruit sauces, flavorings, functional water, liquid diets and the like. The layer structure of the spout pouch is preferably a laminate/polyamide layer/PO layer structure or a polyamide layer/laminate/PO layer structure, and an adhesion layer may be provided between the layers. Since such a spout pouch includes the laminate described above, the spout pouch is superior in gas barrier properties, and consequently the gas barrier properties will be maintained upon a physical stress such as deformation or an impact. Accordingly, the spout pouch can prevent the contents from altering after transportation, even after storage for a long period of time.

Vertical Form Fill Seal Pouch

The vertical form fill seal pouch is used for packaging e.g. liquids, viscous materials, powder, solid bulk materials, foods in the form of the combination thereof, beverages or the like. The layer structure of the vertical form fill seal pouch is preferably a laminate/polyamide layer/PO layer structure, a laminate/PO layer structure, or a PO layer/laminate/PO layer structure, and an adhesion layer may be provided between the layers. Moreover, in a case where the laminate having a metal vapor deposition layer formed only on one side of the film is used, this laminate may have a structure in which the metal vapor deposition layer is laminated so as to be arranged on the outer side than the film, or a structure in which the metal vapor deposition layer is laminated so as to be arranged on the inner side than the film. Since the packaging material is superior in gas barrier properties, as described above, and the gas barrier properties will be maintained upon a physical stress such as deformation or an impact, the vertical form fill seal pouch, which is an example of the packaging material, can inhibit the deterioration in quality of the contents for a long period of time.

Vacuum Packaging Bag

The vacuum packaging bag is used in intended usages in which packaging in a vacuum state (including a state under a reduced pressure) is desired, for example, the storage of foods, beverages or the like. Since the vacuum packaging bag includes the laminate described above, the vacuum packaging bag is particularly superior in gas barrier properties after the vacuum packaging, and after heat sterilization carried out after the vacuum packaging.

Laminate Tube Container

The laminate tube container is used for packaging, e.g. cosmetics, chemicals, medical drugs, foods, tooth pastes, or the like. Since the laminate tube container includes the laminate described above, the laminate tube container is superior in gas barrier properties, and the gas barrier properties will be maintained upon a physical stress such as deformation or an impact.

Lid Member for Container

The lid member for a container is a lid member for a container into which foods such as processed meats, processed vegetables, processed sea foods and fruits, etc. are packed. Since the lid member for a container includes the laminate described above, the lid member for a container is superior in gas barrier properties and the gas barrier properties will be maintained upon a physical stress such as deformation or an impact. Therefore, the lid member for a container can inhibit the deterioration in quality of the contents, i.e. foods, for a long period of time.

Vacuum Thermal Insulator

The vacuum thermal insulator is used in intended usages in which temperature-retention, i.e., keeping high or low temperatures, is necessary. The vacuum thermal insulator is exemplified by a vacuum thermal insulator in which a core material such as a polyurethane foam is enclosed in an outer covering material in a vacuum state (including a state under a reduced pressure). The outer covering material is formed by, for example, heat-sealing a pair of laminated films formed through laminating at least one laminate described above and least one other layer. The other layer is exemplified by a polyester layer, a polyamide layer, a polyolefin layer, an adhesion layer and the like, and the other layer preferably includes a polyolefin layer that is heat-sealable.

Although the number of layers in the outer covering material and the order of lamination are not particularly limited, the outermost layer is preferably a heat-sealable layer (for example, a polyolefin layer). The layer structure of the outer covering material is preferably a laminate/polyamide layer/PO layer structure, or a polyamide layer/laminate/PO layer structure, and an adhesion layer may be provided between the layers. Moreover, in a case where the laminate having a metal vapor deposition layer formed only on one side of the film is used, this laminate may have a structure in which the metal vapor deposition layer is laminated so as to be arranged on the outer side than the film, or a structure in which the metal vapor deposition layer is laminated so as to be arranged on the inner side than the film.

Since the outer covering material includes the laminate described above, the vacuum thermal insulator is superior in gas barrier properties. Therefore, the vacuum thermal insulator can exhibit a thermal insulation effect for a long period of time, and accordingly the vacuum thermal insulator can be used in thermal insulation materials for household electric appliances such as refrigerators, hot water supplying apparatuses and rice cookers; thermal insulation materials for housing for use in walls, ceilings, attics, floors or the like; roofing's for vehicles; thermal insulation panels for vending machines, etc.; and the like.

EXAMPLES

Hereinafter, the embodiments of the present invention will be explained in detail by way of Examples. However, the present invention is not in anyhow limited to the following Examples.

Analyses and evaluations of EVOH resin compositions and the like in Examples and Comparative Examples were carried out using methods described below.

(1) Determination of Moisture Content of Hydrous EVOH Pellets

The moisture content of hydrous EVOH pellets was determined under conditions involving a drying temperature of 180° C., a drying time period of 20 min and a sample amount of about 10 g using a halogen moisture analyzer "HR73" available from Mettler-Toledo International Inc. The moisture content of the hydrous EVOH set forth in the following is expressed in % by mass with respect to the mass of the dry EVOH.

(2) Ethylene Content and Degree of Saponification of EVOH (A)

The determination was made based on $^1$H-NMR recorded on a nuclear magnetic resonance apparatus (nuclear magnetic resonance apparatus with a superconducting magnet, "Lambda 500", available from JEOL, Ltd.) using DMSO-$d_6$ as a solvent for measurement.

(3) Quantitative Determination of Carboxylic Acid and Carboxylic Acid Ion

Dry EVOH pellets were ground by freeze grinding. Thus resulting ground EVOH was sieved with a sieve having a nominal dimension of 1 mm (according to normal sieve standard JIS Z8801-1 to 3). Ten grams of the EVOH powder having passed the sieve and 50 mL of ion exchanged water were charged into a 100 mL stoppered Erlenmeyer flask, and stirred at 95° C. for 10 hours after the stoppered Erlenmeyer flask was equipped with a cooling condenser. Two mL of the resulting solution was diluted with 8 mL of ion exchanged water. The amount of a carboxylic acid ion in this diluted solution was quantitatively determined using an ion chromatograph "ICS-1500" available from Yokogawa Electric Corporation according to the following measurement conditions, whereby the amount of the carboxylic acid and the carboxylic acid ion was calculated. It is to be noted that in the quantitative determination, a calibration curve created using a monocarboxylic acid or a polyhydric carboxylic acid was used.

Measurement Conditions:

column: "IonPAC ICE-AS1 (9φ×250 mm, electric conductivity detector)" available from DIONEX;

eluent: 1.0 mmol/L aqueous octanesulfonic acid solution;

measurement temperature: 35° C.;

eluent flow rate: 1 mL/min.; and amount used for analysis: 50 µL.

(4) Quantitative Determination of Inorganic Particles (B) and Metal Ion

Into a fluorocarbon resin pressure container available from Actac Project Services Corporation were charged 0.5 g of dry EVOH pellets, and 5 mL of nitric acid for accurate analysis available from Wako Pure Chemical Industries, Ltd. was further added thereto. After the pressure container was left to stand for 30 min, the container was closed with a cap lip having a rupture disk, and the dry EVOH pellets were treated at 150° C. for 10 min, and then at 180° C. for 10 min using a microwave high speed decomposition system "speedwave MWS-2" available from Actac Project Services Corporation, whereby the dry EVOH pellet were decomposed. In a case where the decomposition of the dry EVOH pellets was incomplete, the treatment conditions were appropriately adjusted. The resulting decomposition product was diluted with 10 mL of ion exchanged water, all the liquid was transferred to a 50 mL volumetric flask, and the volume of the liquid was adjusted to 50 mL with ion exchanged water, whereby a decomposition product solution was prepared.

The decomposition product solution thus obtained was subjected to a quantitative determination analysis at the measurement wavelengths set forth below using an ICP optical emission spectrophotometer "Optima 4300 DV" available from PerkinElmer Japan Co., Ltd., whereby the amounts of each kind of the inorganic particles (B), the metal ion, the phosphorus compound and the boron compound were quantitatively determined. The content of each kind of the inorganic particles (B) was calculated in terms of oxide equivalent after the quantitative determination of the metal element. Specifically, the content of each kind of the inorganic particles (B) was calculated assuming that the inorganic particles (B) were silicon oxide, aluminum oxide, magnesium oxide, zirconium oxide, cerium oxide, tungsten oxide, or molybdenum oxide. In a case where a plurality of metals were contained, the content of the inorganic particles (B) was calculated as the amount of a plurality of metal oxides. The amount of the phosphorus compound was calculated in terms of phosphate radical equivalent after the quantitative determination of the phosphorus element. The content of the boron compound calculated in terms of boron element equivalent.

Na: 589.592 nm

K: 766.490 nm;

Mg: 285.213 nm;

Ca: 317.933 nm;
P: 214.914 nm;
B: 249.667 nm;
Si: 251.611 nm;
Al: 396.153 nm;
Zr: 343.823 nm;
Ce: 413.764 nm;
W: 207.912 nm; and
Mo: 202.031 nm.

(5) Quantitative Determination Method of Aliphatic Carbonyl Compound (C) (Saturated Aldehyde (c-1), Unsaturated Aldehyde (c-2) or Saturated Ketone (c-3))

A DNPH solution was prepared by adding 50 mL of 1,1,1,3,3,3-hexafluoroisopropanol (HFIP), 11.5 mL of acetic acid and 8 mL of ion exchanged water to 200 mg of a 50% by mass solution of 2,4-dinitrophenylhydrazine (DNPH). Thereafter, 1 g of a sample (dry resin composition pellets, a film or a laminate) was added to 20 mL of the DNPH solution, and the sample was dissolved at 35° C. for 1 hour with stirring. Acetonitrile was added to this solution to permit precipitation of the EVOH, followed by filtration and concentration, whereby an extracted sample was obtained. This extracted sample was subjected to quantitative determination analysis by high performance liquid chromatography, whereby the aliphatic carbonyl compound (C) was quantitatively determined. It is to be noted that in the quantitative determination, a calibration curve created using an authentic sample prepared by reacting the corresponding aliphatic carbonyl compound (C) with the prepared DNPH solution was used.

Analytical Conditions:
column: TSKgel ODS-80 Ts (available from Tosoh Corporation);
mobile phase: water/acetonitrile=52:48 (volume ratio);
detectors: PDA (360 nm), and TOF-MS.

(6) Preparation of Inorganic Particles (B) Having Different Particle Diameter

In the case of the silicon atom-containing inorganic particles (B), "Sylysia 380" (mean particle diameter: 9.0 μm) or Sylysia 310P (mean particle diameter: 2.7 μm) each available from Fuji Silysia Chemical Ltd. was ground and classified with a sieve to permit adjustment to a desired size.

Similarly, commercially available $SiO_2 \cdot Al_2O_3$, $SiO_2 \cdot MgO$, $CeO_2$, $ZrO_2$, $WO_3$ and $MoO_3$ were ground and classified with a sieve to permit adjustment to a desired size.

(7) Determination of Mean Particle Diameter of Inorganic Particles (B)

The mean particle diameter of the inorganic particles (B) was determined using a laser diffraction particle size analyzer "SALD-2200" available from Shimadzu Corporation. A sample for evaluation was prepared by adding 50 cc of pure water and 5 g of inorganic particles (B) to be determined to a glass beaker, stirring the mixture with a spatula, and thereafter subjecting the mixture to a dispersion treatment for 10 min in an ultrasonic cleaner. Next, the dispersion-treated liquid containing the inorganic particles (B) was charged into a sampler unit of the analyzer, and the measurement was conducted when the absorbance was stabilized. Then, the particle diameter distribution (a particle diameter and a relative amount of particles) was calculated based on light intensity distribution data of the light diffracted/scattered on the particles. The mean particle diameter was calculated by multiply the measured particle diameter by the relative amount of the particles to give a product, and dividing the product by the sum of the relative amount of the particles. It is to be noted that the mean particle diameter means an average of the diameter of the particles.

(8) Production of Film

Dry EVOH pellets were melted at 240° C., and extruded from a die onto a casting roll concurrently with blowing an air toward the extrudate at a wind velocity of 30 m/sec using an air knife, whereby an unstretched EVOH film having a thickness of 170 μm was obtained. This unstretched EVOH film was brought into contact with hot water at 80° C. for 10 sec, stretched 3.2-fold along a machine direction and 3.0-fold along a transverse direction in an atmosphere at 90° C. using a tenter type simultaneous biaxial stretching apparatus, and further heat-treated for 5 sec in a tenter conditioned at 170° C., followed by cutting the ends of the film, whereby the following biaxially stretched film was obtained:
film thickness: 12 μm
film width: 50 cm
film roll length: 4,000 m
number of rolls: 100.

(9) Evaluation of Odor Generated in Molding

Into a 100 mL glass sample tube were charged 20 g of sample pellets of the resin composition, and the opening of the sample tube was covered with an aluminum foil lid. Then, the sample tube was heated in a hot-air dryer at 220° C. for 30 min. The sample tube was taken out from the dryer and allowed to cool at room temperature for 30 min. Thereafter, the sample tube was shaken two or three times, and checked for odor after removing the aluminum foil lid. The intensity of the odor of the sample pellets was evaluated in accordance with the following criteria.

Decision Criteria:
A: an odor not being recognized;
B: an odor being slightly recognized; and
C: an odor being clearly recognized.

(10) Determination of Color of End of Film

For an evaluation of appearance characteristics after melt molding of the resin composition, the obtained biaxially stretched film was wound around a cardboard tube, and the color of the end of the film was observed with the naked eye.

The decision criteria were as in the following.
Decision Criteria:
A: not being colored;
B: being light yellow; and
C: being colored.

(11) Determination of Arithmetic Mean Height (Ra) and Average Length (RSm) of Profile Elements of Film Surface The determination of the arithmetic average roughness (Ra) and the average length (RSm) of the profile elements was made on the surface of the obtained biaxially stretched film in accordance with JIS B0601: 2001 using a laser microscope for profilometry "VK-X200" available from Keyence Corporation. In each determination, the number of measurements was 100, and an average of values obtained was designated as the measurement value. The arithmetic mean height (Ra) and the average length (RSm) of the profile elements of the film surface were each evaluated in accordance with the following criteria.

Decision Criteria:
Arithmetic Average Roughness (Ra):
A: 0.20 μm or greater and 0.40 μm or less;
B: 0.15 μm or greater and less than 0.20 μm, or greater than 0.40 μm and 0.60 μm or less;
C: 0.10 μm or greater and less than 0.15 μm, or greater than 0.60 μm and 0.80 μm or less;
D: 0.05 μm or greater and less than 0.10 μm, or greater than 0.80 μm and 1.00 μm or less; and
E: less than 0.05 μm, or greater than 1.00 μm.

Average Length (Rsm) of Profile Elements
A: 200 μm or greater and 400 μm or less;

B: 150 μm or greater and less than 200 μm, or greater than 400 μm and 600 μm or less;
C: 100 μm or greater and less than 150 μm, or greater than 600 μm and 800 μm or less;
D: 50 μm or greater and less than 100 μm, or greater than 800 μm and 1,000 μm or less; and
E: less than 50 μm, or greater than 1,000 μm.

(12) Determination of Number of Breaks of Film

The film-breaking resistance of the resin composition and the film obtained therefrom was evaluated based on the number of breaks of the obtained biaxially stretched film when the obtained biaxially stretched film was fed to a slitter and wound around a film roll under a tension of 100 N/m. The decision criteria were as in the following.

Decision Criteria:
A: 0 to 1 break/100 rolls;
B: 2 to 4 breaks/100 rolls;
C: 5 to 7 breaks/100 rolls;
D: 8 to 10 breaks/100 rolls; and
E: 11 breaks or greater/100 rolls.

(13) Content of Volatile Matter in Film

A piece for determination of the content of volatile matter was cut out from the central portion of the roll having the entire width of 80 cm and dried at 105° C. for 3 hours using a hot-air dryer. The content of the volatile matter was determined based on the mass before drying and the mass after drying according to the following equation:

content of volatile matter (% by mass)=[(mass before drying)−(mass after drying)]/(mass after drying)×100

(14) Production of Laminate

One hundred rolls of biaxially stretched film obtained were used, and aluminum was vapor-deposited on one side of the film using a batch-wise vapor deposition equipment "EWA-105" available from ULVAC, Inc. at a film travelling speed of 200 m/min, whereby a laminate was obtained.

(15) Measurement of Thickness of Metal Vapor Deposition Layer

The resulting laminate was cut with a microtome, whereby a cross section was exposed. This cross section was observed using a scanning electron microscope (SEM) ("ZEISS ULTRA 55" available from SII Nano Technology, Inc.), and the thickness of the vapor deposition layer was measured using a backscattered electron detector.

(16) Vapor Deposition Defects-Inhibiting Properties

For an evaluation of the vapor deposition defects-inhibiting properties of the resin composition and the laminate obtained therefrom, the following (16-1) to (16-3) were conducted.

(16-1) Determination of Number of Vapor Deposition Defects

The first roll of the laminate thus obtained was fed to a slitter, and the winding of the laminate was started with fluorescent lighting at 100 W from below the film. The number of vapor deposition defects was counted in a region having a width of 0.5 m and a length of 2 m at different 10 points, and the average of the 10 values was designated as the number of vapor deposition defects per square meter. In regard to the vapor deposition defects, an evaluation was made according to the following criteria.

Decision Criteria:
A: 0 to 20 defects/m$^2$;
B: 21 to 40 defects/m$^2$;
C: 41 to 60 defects/m$^2$;
D: 61 to 80 defects/m$^2$;
E: 81 to 100 defects/m$^2$; and
F: 101 defects or greater/m$^2$.

(16-2) Determination of Number of Vapor Deposition Defects (Time-Dependent Number of Vapor Deposition Defects)

The hundredth roll of the laminate thus obtained was fed to a slitter, and the winding of the laminate was started with fluorescent lighting at 100 W from below the film. The number of vapor deposition defects was counted in a region having a width of 0.5 m and a length of 2 m at different 10 points, and the average of the 10 values was designated as the number of vapor deposition defects per square meter. In regard to the vapor deposition defects, an evaluation was made in accordance with the following criteria.

Decision Criteria:
A: 0 to 20 defects/m$^2$;
B: 21 to 40 defects/m$^2$;
C: 41 to 60 defects/m$^2$;
D: 61 to 80 defects/m$^2$;
E: 81 to 100 defects/m$^2$; and
F: 101 defects or greater/m$^2$.

(16-3) Evaluation of Degree of Time-Dependent Increase of Number of Vapor Deposition Defects As an indicator of the long-run workability of the EVOH resin composition in melt-molding, the degree of a time-dependent increase of the number of vapor deposition defects was evaluated, and determined in accordance with the following criteria.

Decision Criteria:
A: the difference in rank of the vapor deposition defects between the first laminate and the hundredth laminate not being found;
B: the difference in rank of the vapor deposition defects between the first laminate and the hundredth laminate being 1; and
C: the difference in rank of the vapor deposition defects between the first laminate and the hundredth laminate being 2.

(17) Evaluation of Adhesive Strength between Vapor Deposition Layer and EVOH Film Layer The adhesive strength between the vapor deposition layer and other resin layer in the laminate and the film formed from the resin composition was evaluated.

Measurement of Adhesive Strength

An adhesive for dry lamination (a solution prepared by mixing "TAKELAC A-385" and "TAKELAC A-50", each available from Mitsui Chemicals, Inc., in a mass ratio of 6/1, and adjusting the solid content concentration to 23% by mass with ethyl acetate) was coated on the surface on the vapor deposition layer side of the obtained laminate using a bar coater, followed by hot-air drying at 50° C. for 5 min, and this laminate was laminated on a PET film (E5000 manufactured by Toyobo Co., Ltd.; thickness: 12 μm) using a nip roll heated at 80° C. In this lamination, an unattached portion was also prepared in a half of the film by placing an aluminum foil between the laminate and the PET film. Thereafter, aging was conducted at 40° C. for 72 hours, whereby a laminated film was obtained. The obtained laminated film was cut into a strip having a size of 100 mm×15 mm centering a boundary line of aluminum vapor deposition, and a T-peel test was conducted five times using a tensile tester at a tensile rate of 10 mm/min. An average of the obtained measurement values was designated as the adhesive strength. The adhesive strength was evaluated in accordance with the following criteria.

Decision Criteria:
A: 500 g/15 mm or greater;
B: 450 g or greater and less than 500 g/15 mm;

C: 400 g or greater and less than 450 g/15 mm;

D: 350 g or greater and less than 400 g/15 mm; and

E: less than 350 g/15 mm.

Time-Dependent Change of Adhesive Strength

In continuous production of the laminate, the adhesive strength of the hundredth laminate was evaluated in accordance with the same decision method as that for the first laminate, and the rank of the adhesive strength was compared between the first laminate and the hundredth laminate, whereby the time-dependent change of the adhesive strength was evaluated.

Decision Criteria:

A: the difference in rank of the vapor deposition defects between the first laminate and the hundredth laminate not being found;

B: the difference in rank of the vapor deposition defects between the first laminate and the hundredth laminate being 1; and C: the difference in rank of the vapor deposition defects between the first laminate and the hundredth laminate being 2.

(18) Oxygen Transmission Rate

The oxygen transmission rate was measured in accordance with JIS K7126 (equal pressure method): 2006, using an oxygen transmission rate meter ("MOCON OX-TRAN2/20" available from Modern Controls, Inc.; detection lower limit: 0.01 mL/m$^2$·day·atm) and a sample prepared by cutting out a part of the laminate. The measurement conditions involved a temperature of 40° C., a humidity on an oxygen supply side of 90% RH, a humidity on a carrier gas side of 0% RH, an oxygen pressure of 1 atm, and a carrier gas pressure of 1 atm. In regard to the procedure for mounting the laminate on the oxygen transmission rate meter, in the case of the laminate having a metal vapor deposition layer formed on one side of the film, the front face side of the metal vapor deposition layer was situated on the oxygen supply side, whereas the exposed side of the film was situated on the carrier gas side. In the laminate having the metal vapor deposition layer on both sides, the laminate was placed without selecting the face to be situated on the oxygen supply side or the carrier gas side.

Example 1: Synthesis of Hydrous EVOH Pellets

Polymerization was carried out in a 250 L pressure reactor under the following conditions to synthesize an ethylene-vinyl acetate copolymer.

Amount Charged vinyl acetate: 83.0 kg methanol: 17.4 kg 2,2'-azobisisobutyronitrile: 66.4 g Polymerization Conditions polymerization temperature: 60° C.

ethylene pressure in polymerization reactor: 3.9 MPa polymerization time period: 3.5 hours The rate of polymerization of vinyl acetate in the above polymerization was 36%. After sorbic acid was added to the resulting copolymerization reaction liquid, the liquid was supplied to a purge tower, and after unreacted vinyl acetate was eliminated from the top of the tower by introducing methanol vapor from the bottom of the tower, a 41% by mass methanol solution of an ethylene-vinyl acetate copolymer was obtained. This ethylene-vinyl acetate copolymer had an ethylene content of 32 mol %. This methanol solution of the ethylene-vinyl acetate copolymer was charged into a saponification reactor, a solution of sodium hydroxide in methanol (80 g/L) was added so as to attain 0.4 equivalents with respect to the vinyl ester unit in the copolymer, and methanol was further added to adjust the copolymer concentration of 20% by mass. The temperature of this solution was elevated to 60° C., and the reaction was allowed while blowing a nitrogen gas into the reactor for about 4 hours. After the completion of the reaction, acetic acid and water were added for neutralization, and the reaction liquid was neutralized, whereby the reaction was stopped. To this solution was added synthetic silica "Sylysia 310P" (the mean particle diameter as determined using a laser technique: 2.7 m) available from Fuji Silysia Chemical Ltd. so as to attain 300 ppm with respect to the EVOH, and further, propanal as the aliphatic carbonyl compound (C) was added to the EVOH. Then, the solution was extruded from a die plate provided with a circular opening into water to permit deposition, followed by cutting, whereby hydrous EVOH pellets having a diameter of about 3 mm and a length of about 5 mm were obtained. The moisture content of the hydrous EVOH pellet thus obtained was 110% by mass.

The hydrous EVOH pellets thus obtained were charged into an aqueous solution prepared by dissolving acetic acid, sodium acetate, phosphoric acid and boric acid in water so as to attain 0.79 g/L of acetic acid, 0.53 g/L of sodium acetate, 0.012 g/L of phosphoric acid and 0.42 g/L of boric acid, and immersed in the aqueous solution for 6 hours with stirring at intervals. The hydrous EVOH pellets after the immersion were subjected to deliquoring through centrifugation to achieve dewatering, and dried in a hot-air dryer at 80° C. for 3 hours, and subsequently at 120° C. for 35 hours to obtain a dry EVOH resin composition (dry EVOH pellets).

The ethylene content and the degree of saponification of the dry EVOH resin composition thus obtained were analyzed in accordance with the methods described above, and the ethylene content (Et) was found to be 32.0 mol %, and the degree of saponification (DS) was found to be 99.98 mol % or greater. In addition, the dry EVOH resin composition was analyzed in accordance with the methods described above, and consequently it was found that the content of the inorganic particles (B) was 300 ppm in terms of silicon dioxide equivalent, the content of the saturated aldehyde (c-1) was 2.9 ppm, the content of acetic acid and the acetic acid ion was 8.00 mol/g, the content of the sodium ion was 6.96 mol/g, the content of the phosphorus compound was 10 ppm in terms of phosphate radical equivalent, and the content of the boron compound was 201 ppm in terms of boron element equivalent.

Production of Film Through Biaxially Stretching

The EVOH resin composition thus obtained was formed into a film precursor, and a film was produced according to a method involving the use of a simultaneous biaxial stretching machine. Each physical property was evaluated on the film, and it was found that the arithmetic average roughness (Ra) of the film surface as determined in accordance with JIS B0601 was 0.28 μm, and the average length (RSm) of the profile elements of the film surface as determined in accordance with JIS B0601 was 298 μm. Both of the arithmetic average roughness (Ra) and the average length (RSm) of the profile elements were evaluated as "A". Moreover, after winding the film in the form of a roll, yellowing was not found on the end face of the roll, leading an evaluation as "A". Furthermore, the number of breaks in the film processing was 1, leading an evaluation as "A". The thickness of the vapor deposition layer in the laminate (laminate having an aluminum vapor deposition layer) produced was 50 nm. The number of vapor deposition defects in the first roll of the laminate was 9 defects/m$^2$, and the number of vapor deposition defects in the hundredth roll of the laminate was 12 defects/m$^2$, both leading an evaluation as "A". Based on this result, the time-dependent increase of the vapor deposition defects was evaluated as "A". The adhesive strength between the vapor deposition layer and the EVOH film layer in the laminate was 530 g/15 mm, leading an evaluation as "A".

Production of Film Through Casting Process

The EVOH resin composition obtained above was melted at 240° C., and extruded from a die onto a casting roll. The film was wound after the cutting the film end, whereby a film roll was obtained. A film roll superior in appearance was obtained.

Production of Packaging Material (Pouch)

The laminate (laminate having an aluminum vapor deposition layer) EVOH film obtained above as an intermediate layer, a PET film ("E5000" available from Toyobo Co., Ltd.) as an outer layer (on the vapor deposition layer side of the laminate (laminate having an aluminum vapor deposition layer)), and an unstretched polypropylene film (hereinafter, may be also referred to as "CPP"; "RXC-18" available from Tohcello Co., Ltd.; thickness: 60 µm) as an inner layer (on the EVOH layer side of the laminate (laminate having an aluminum vapor deposition layer)) were used. An adhesive for dry lamination (a solution prepared by mixing "TAKE-LAC A-385" and "TAKELAC A-50", each available from Mitsui Chemicals, Inc., in a mass ratio of 6/1, and adjusting the solid content concentration to 23% by mass with ethyl acetate) was coated on one side of the PET and on one side of the CPP using a bar coater, followed by drying with hot-air at 50° C. for 5 min. Then, the PET film and the CPP film were attached to the laminate EVOH film such that the laminate EVOH film was situated between the adhesive-coated surfaces, and aging was conducted at 40° C. for 5 days, whereby a laminate having a layer structure of PET/adhesive layer/EVOH layer/adhesive layer/CPP was obtained. Next, the laminate obtained was formed into a pouch through heat-sealing, and 100 g of water was charged thereinto.

Examples 2 to 117 and Comparative Examples 1 to 22

Dry EVOH resin compositions, films and laminates (laminates having an aluminum vapor deposition layer) were obtained in a similar manner to Example 1 except that the type and amount of the inorganic particles (B) and the aliphatic carbonyl compound (C), as well as the thickness of the vapor deposition layer in Example 1 were changed as shown in Tables 1 to 3. The results of the evaluations of each EVOH resin composition, film and laminate thus obtained are shown in Tables 4 to 6.

TABLE 1

| | Inorganic particles (B) | | | Aliphatic carbonyl compound (C) (saturated aldehyde (c-1)) | | Mass ratio (B)/(C) | Thickness of metal vapor deposition layer (nm) |
|---|---|---|---|---|---|---|---|
| | type | mean particle diameter (µm) | content (ppm) | type | content (ppm) | | |
| Example 1 | SiO$_2$ | 2.7 | 300 | propanal | 2.9 | 103 | 50 |
| Example 2 | SiO$_2$ | 2.7 | 300 | propanal | 0.13 | 2,308 | 50 |
| Example 3 | SiO$_2$ | 2.7 | 300 | propanal | 48 | 6 | 50 |
| Example 4 | SiO$_2$ | 2.7 | 300 | propanal | 98 | 3 | 50 |
| Example 5 | SiO$_2$ | 2.7 | 300 | propanal | 0.07 | 4,286 | 50 |
| Example 6 | SiO$_2$ | 2.7 | 160 | propanal | 2.9 | 55 | 50 |
| Example 7 | SiO$_2$ | 2.7 | 103 | propanal | 2.9 | 36 | 50 |
| Example 8 | SiO$_2$ | 2.7 | 52 | propanal | 2.9 | 18 | 50 |
| Example 9 | SiO$_2$ | 2.7 | 2,800 | propanal | 2.9 | 966 | 50 |
| Example 10 | SiO$_2$ | 2.7 | 3,900 | propanal | 2.9 | 1,345 | 50 |
| Example 11 | SiO$_2$ | 2.7 | 4,800 | propanal | 2.9 | 1,655 | 50 |
| Example 12 | SiO$_2$ | 2.7 | 300 | propanal | 5 | 60 | 50 |
| Example 13 | SiO$_2$ | 2.7 | 650 | propanal | 0.07 | 9,286 | 50 |
| Example 14 | SiO$_2$ | 2.7 | 800 | propanal | 0.07 | 11,429 | 50 |
| Example 15 | SiO$_2$ | 2.7 | 52 | propanal | 98 | 0.5 | 50 |
| Example 16 | SiO$_2$ | 4.9 | 300 | propanal | 2.9 | 103 | 50 |
| Example 17 | SiO$_2$ | 1.6 | 300 | propanal | 2.9 | 103 | 50 |
| Example 18 | SiO$_2$ | 0.6 | 300 | propanal | 2.9 | 103 | 50 |
| Example 19 | SiO$_2$ | 0.4 | 300 | propanal | 2.9 | 103 | 50 |
| Example 20 | SiO$_2$ | 7.9 | 300 | propanal | 2.9 | 103 | 50 |
| Example 21 | SiO$_2$ | 9.0 | 300 | propanal | 2.9 | 103 | 50 |
| Example 22 | SiO$_2$ | 11 | 300 | propanal | 2.9 | 103 | 50 |
| Example 23 | SiO$_2$·Al$_2$O$_3$ | 1.0 | 300 | propanal | 2.9 | 103 | 50 |
| Example 24 | SiO$_2$·MgO | 3.0 | 300 | propanal | 2.9 | 103 | 50 |
| Example 25 | SiO$_2$·Al$_2$O$_3$ | 0.6 | 300 | propanal | 2.9 | 103 | 50 |
| Example 26 | CeO$_2$ | 3.0 | 300 | propanal | 2.9 | 103 | 50 |
| Example 27 | ZrO$_2$ | 3.0 | 300 | propanal | 2.9 | 103 | 50 |
| Example 28 | WO$_3$ | 3.0 | 300 | propanal | 2.9 | 103 | 50 |
| Example 29 | MoO$_3$ | 3.0 | 300 | propanal | 2.9 | 103 | 50 |
| Example 30 | SiO$_2$ | 2.7 | 300 | butanal | 48 | 6 | 50 |
| Example 31 | SiO$_2$ | 2.7 | 300 | hoxanal | 48 | 6 | 50 |
| Example 32 | SiO$_2$ | 2.7 | 300 | propanal | 2.9 | 103 | 80 |
| Example 33 | SiO$_2$ | 2.7 | 300 | propanal | 2.9 | 103 | 120 |
| Example 34 | SiO$_2$ | 2.7 | 300 | propanal | 2.9 | 103 | 140 |
| Example 35 | SiO$_2$ | 2.7 | 300 | propanal | 2.9 | 103 | 160 |
| Example 36 | SiO$_2$ | 2.7 | 300 | propanal | 2.9 | 103 | 43 |
| Example 37 | SiO$_2$ | 2.7 | 300 | propanal | 2.9 | 103 | 37 |
| Example 38 | SiO$_2$ | 2.7 | 300 | propanal | 2.9 | 103 | 32 |
| Example 39 | SiO$_2$ | 2.7 | 300 | propanal | 2.9 | 103 | 27 |

TABLE 1-continued

| | Inorganic particles (B) | | | Aliphatic carbonyl compound (C) (saturated aldehyde (c-1)) | | Mass ratio (B)/(C) | Thickness of metal vapor deposition layer (nm) |
|---|---|---|---|---|---|---|---|
| | type | mean particle diameter (μm) | content (ppm) | type | content (ppm) | | |
| Comparative Example 1 | SiO₂ | 2.7 | 45 | propanal | N.D. | — | 50 |
| Comparative Example 2 | SiO₂ | 2.7 | 5,100 | propanal | 110 | 46 | 50 |
| Comparative Example 3 | SiO₂ | 2.7 | 45 | propanal | 2.9 | 16 | 50 |
| Comparative Example 4 | SiO₂ | 2.7 | 300 | propanal | 110 | 3 | 50 |
| Comparative Example 5 | SiO₂ | 2.7 | 5,100 | propanal | 2.9 | 1,759 | 50 |
| Comparative Example 6 | SiO₂ | 2.7 | 45 | propanal | 110 | 0.4 | 50 |
| Comparative Example 7 | SiO₂ | 2.7 | 300 | propanal | N.D. | — | 50 |
| Comparative Example 8 | SiO₂ | 2.7 | 5,100 | propanal | N.D. | — | 50 |

Lower measurement limit of the mean particle diameter of the inorganic particles: 0.1 μm
N.D.: less than the detection lower limit (0.01 ppm)

TABLE 2

| | Inorganic particles (B) | | | Aliphatic carbonyl compound (C) (unsaturated aldehyde (c-2)) | | Mass ratio (B)/(C) | Thickness of metal vapor deposition layer (nm) |
|---|---|---|---|---|---|---|---|
| | type | mean particle diameter (μm) | content (ppm) | type | content (ppm) | | |
| Example 40 | SiO₂ | 2.7 | 300 | crotonaldehyde | 2.9 | 103 | 50 |
| Example 41 | SiO₂ | 2.7 | 300 | crotonaldehyde | 0.13 | 2,308 | 50 |
| Example 42 | SiO₂ | 2.7 | 300 | crotonaldehyde | 48 | 6 | 50 |
| Example 43 | SiO₂ | 2.7 | 300 | crotonaldehyde | 98 | 3 | 50 |
| Example 44 | SiO₂ | 2.7 | 300 | crotonaldehyde | 0.07 | 4,286 | 50 |
| Example 45 | SiO₂ | 2.7 | 160 | crotonaldehyde | 2.9 | 55 | 50 |
| Example 46 | SiO₂ | 2.7 | 103 | crotonaldehyde | 2.9 | 36 | 50 |
| Example 47 | SiO₂ | 2.7 | 52 | crotonaldehyde | 2.9 | 18 | 50 |
| Example 48 | SiO₂ | 2.7 | 2,800 | crotonaldehyde | 2.9 | 966 | 50 |
| Example 49 | SiO₂ | 2.7 | 3,900 | crotonaldehyde | 2.9 | 1,345 | 50 |
| Example 50 | SiO₂ | 2.7 | 4,800 | crotonaldehyde | 2.9 | 1,655 | 50 |
| Example 51 | SiO₂ | 2.7 | 300 | crotonaldehyde | 5.0 | 60 | 50 |
| Example 52 | SiO₂ | 2.7 | 650 | crotonaldehyde | 0.07 | 9,286 | 50 |
| Example 53 | SiO₂ | 2.7 | 800 | crotonaldehyde | 0.07 | 11,429 | 50 |
| Example 54 | SiO₂ | 2.7 | 52 | crotonaldehyde | 98 | 0.5 | 50 |
| Example 55 | SiO₂ | 4.9 | 300 | crotonaldehyde | 2.9 | 103 | 50 |
| Example 56 | SiO₂ | 1.6 | 300 | crotonaldehyde | 2.9 | 103 | 50 |
| Example 57 | SiO₂ | 0.6 | 300 | crotonaldehyde | 2.9 | 103 | 50 |
| Example 58 | SiO₂ | 0.4 | 300 | crotonaldehyde | 2.9 | 103 | 50 |
| Example 59 | SiO₂ | 7.9 | 300 | crotonaldehyde | 2.9 | 103 | 50 |
| Example 60 | SiO₂ | 9.0 | 300 | crotonaldehyde | 2.9 | 103 | 50 |
| Example 61 | SiO₂ | 11 | 300 | crotonaldehyde | 2.9 | 103 | 50 |
| Example 62 | Al₂O₃ | 3.0 | 300 | crotonaldehyde | 2.9 | 103 | 50 |
| Example 63 | SiO₂·MgO | 3.0 | 300 | crotonaldehyde | 2.9 | 103 | 50 |
| Example 64 | Al₂O₃ | 0.6 | 300 | crotonaldehyde | 2.9 | 103 | 50 |
| Example 65 | CeO₂ | 3.0 | 300 | crotonaldehyde | 2.9 | 103 | 50 |
| Example 66 | ZrO₂ | 3.0 | 300 | crotonaldehyde | 2.9 | 103 | 50 |
| Example 67 | WO₃ | 3.0 | 300 | crotonaldehyde | 2.9 | 103 | 50 |
| Example 68 | MoO₃ | 3.0 | 300 | crotonaldehyde | 2.9 | 103 | 50 |
| Example 69 | SiO₂ | 2.7 | 300 | 2,4-hexadienal | 2.9 | 103 | 50 |
| Example 70 | SiO₂ | 2.7 | 300 | 2,4,6-octatrienal | 2.9 | 103 | 50 |
| Example 71 | SiO₂ | 2.7 | 300 | crotonaldehyde | 2.9 | 103 | 80 |
| Example 72 | SiO₂ | 2.7 | 300 | crotonaldehyde | 2.9 | 103 | 120 |
| Example 73 | SiO₂ | 2.7 | 300 | crotonaldehyde | 2.9 | 103 | 140 |
| Example 74 | SiO₂ | 2.7 | 300 | crotonaldehyde | 2.9 | 103 | 160 |
| Example 75 | SiO₂ | 2.7 | 300 | crotonaldehyde | 2.9 | 103 | 43 |
| Example 76 | SiO₂ | 2.7 | 300 | crotonaldehyde | 2.9 | 103 | 37 |
| Example 77 | SiO₂ | 2.7 | 300 | crotonaldehyde | 2.9 | 103 | 32 |
| Example 78 | SiO₂ | 2.7 | 300 | crotonaldehyde | 2.9 | 103 | 27 |

TABLE 2-continued

|  | Inorganic particles (B) | | | Aliphatic carbonyl compound (C) (unsaturated aldehyde (c-2)) | | Mass ratio (B)/(C) | Thickness of metal vapor deposition layer (nm) |
| --- | --- | --- | --- | --- | --- | --- | --- |
|  | type | mean particle diameter (μm) | content (ppm) | type | content (ppm) | | |
| Comparative Example 9 | SiO₂ | 2.7 | 45 | crotonaldehyde | 0.04 | 1,125 | 50 |
| Comparative Example 10 | SiO₂ | 2.7 | 5,100 | crotonaldehyde | 110 | 46 | 50 |
| Comparative Example 11 | SiO₂ | 2.7 | 45 | crotonaldehyde | 2.9 | 16 | 50 |
| Comparative Example 12 | SiO₂ | 2.7 | 300 | crotonaldehyde | 110 | 3 | 50 |
| Comparative Example 13 | SiO₂ | 2.7 | 5,100 | crotonaldehyde | 2.9 | 1,759 | 50 |
| Comparative Example 14 | SiO₂ | 2.7 | 45 | crotonaldehyde | 110 | 0.4 | 50 |

Measurement lower limit of the mean particle diameter of the inorganic particles: 0.1 μm
Measurement lower limit of the content of the unsaturated aldehyde: 0.01 ppm

TABLE 3

|  | Inorganic particles (B) | | | Aliphatic carbonyl compound (C) (saturated ketone (c-3)) | | Mass ratio (B)/(C) | Thickness of metal vapor deposition layer (nm) |
| --- | --- | --- | --- | --- | --- | --- | --- |
|  | type | mean particle diameter (μm) | content (ppm) | type | content (ppm) | | |
| Example 79 | SiO₂ | 2.7 | 300 | acetone | 2.9 | 103 | 50 |
| Example 80 | SiO₂ | 2.7 | 300 | acetone | 0.13 | 2,308 | 50 |
| Example 81 | SiO₂ | 2.7 | 300 | acetone | 48 | 6 | 50 |
| Example 82 | SiO₂ | 2.7 | 300 | acetone | 98 | 3 | 50 |
| Example 83 | SiO₂ | 2.7 | 300 | acetone | 0.07 | 4,286 | 50 |
| Example 84 | SiO₂ | 2.7 | 160 | acetone | 2.9 | 55 | 50 |
| Example 85 | SiO₂ | 2.7 | 103 | acetone | 2.9 | 36 | 50 |
| Example 86 | SiO₂ | 2.7 | 52 | acetone | 2.9 | 18 | 50 |
| Example 87 | SiO₂ | 2.7 | 2,800 | acetone | 2.9 | 966 | 50 |
| Example 88 | SiO₂ | 2.7 | 3,900 | acetone | 2.9 | 1,345 | 50 |
| Example 89 | SiO₂ | 2.7 | 4,800 | acetone | 2.9 | 1,655 | 50 |
| Example 90 | SiO₂ | 2.7 | 300 | acetone | 5.0 | 60 | 50 |
| Example 91 | SiO₂ | 2.7 | 650 | acetone | 0.07 | 9,286 | 50 |
| Example 92 | SiO₂ | 2.7 | 800 | acetone | 0.07 | 11,429 | 50 |
| Example 93 | SiO₂ | 2.7 | 52 | acetone | 98 | 0.5 | 50 |
| Example 94 | SiO₂ | 4.9 | 300 | acetone | 2.9 | 103 | 50 |
| Example 95 | SiO₂ | 1.6 | 300 | acetone | 2.9 | 103 | 50 |
| Example 96 | SiO₂ | 0.6 | 300 | acetone | 2.9 | 103 | 50 |
| Example 97 | SiO₂ | 0.4 | 300 | acetone | 2.9 | 103 | 50 |
| Example 98 | SiO₂ | 7.9 | 300 | acetone | 2.9 | 103 | 50 |
| Example 99 | SiO₂ | 9.6 | 300 | acetone | 2.9 | 103 | 50 |
| Example 100 | SiO₂ | 11 | 300 | acetone | 2.9 | 103 | 50 |
| Example 101 | SiO₂·Al₂O₂ | 3.0 | 300 | acetone | 2.9 | 103 | 50 |
| Example 102 | SiO₂·MgO | 3.0 | 300 | acetone | 2.9 | 103 | 50 |
| Example 103 | SiO₂·Al₂O₂ | 0.6 | 300 | acetone | 2.9 | 103 | 50 |
| Example 104 | CeO₂ | 3.0 | 300 | acetone | 2.9 | 103 | 50 |
| Example 105 | ZrO₂ | 3.0 | 300 | acetone | 2.9 | 103 | 50 |
| Example 106 | WO₃ | 3.0 | 300 | acetone | 2.9 | 103 | 50 |
| Example 107 | MoO₃ | 3.0 | 300 | acetone | 2.9 | 103 | 50 |
| Example 108 | SiO₂ | 2.7 | 300 | methyl ethyl ketone | 48 | 6 | 50 |
| Example 109 | SiO₂ | 2.7 | 300 | 2-hexanone | 48 | 6 | 50 |
| Example 110 | SiO₂ | 2.7 | 300 | acetone | 2.9 | 103 | 80 |
| Example 111 | SiO₂ | 2.7 | 300 | acetone | 2.9 | 103 | 120 |
| Example 112 | SiO₂ | 2.7 | 300 | acetone | 2.9 | 103 | 140 |
| Example 113 | SiO₂ | 2.7 | 300 | acetone | 2.9 | 103 | 160 |
| Example 114 | SiO₂ | 2.7 | 300 | acetone | 2.9 | 103 | 43 |
| Example 115 | SiO₂ | 2.7 | 300 | acetone | 2.9 | 103 | 37 |
| Example 116 | SiO₂ | 2.7 | 300 | acetone | 2.9 | 103 | 32 |
| Example 117 | SiO₂ | 2.7 | 300 | acetone | 2.9 | 103 | 27 |
| Comparative Example 15 | SiO₂ | 2.7 | 45 | acetone | N.D. | — | 50 |
| Comparative Example 16 | SiO₂ | 2.7 | 5,100 | acetone | 110 | 46 | 50 |
| Comparative Example 17 | SiO₂ | 2.7 | 45 | acetone | 2.9 | 16 | 50 |
| Comparative Example 18 | SiO₂ | 2.7 | 300 | acetone | 110 | 3 | 50 |

TABLE 3-continued

|  | Inorganic particles (B) | | | Aliphatic carbonyl compound (C) (saturated ketone (c-3)) | | | Thickness of metal vapor deposition layer (nm) |
|---|---|---|---|---|---|---|---|
|  | type | mean particle diameter (μm) | content (ppm) | type | content (ppm) | Mass ratio (B)/(C) | |
| Comparative Example 19 | SiO$_2$ | 2.7 | 5,100 | acetone | 2.9 | 1,759 | 50 |
| Comparative Example 20 | SiO$_2$ | 2.7 | 45 | acetone | 110 | 0.4 | 50 |
| Comparative Example 21 | SiO$_2$ | 2.7 | 300 | acetone | N.D. | — | 50 |
| Comparative Example 22 | SiO$_2$ | 2.7 | 5,100 | acetone | N.D. | — | 50 |

Measurement lower limit of the mean particle diameter of the inorganic particles: 0.1 μm
N.D.: less than the detection lower limit (0.01 ppm)

TABLE 4

|  | Arithmetic average roughness (Ra) | Average length (RSm) of profile elements | Odor in molding | Color of end of film | Number of breaks | Number of vapor deposition defects | Time-dependent number of vapor deposition defects | Time-dependent increase of number of vapor deposition defects | Adhesive strength |
|---|---|---|---|---|---|---|---|---|---|
| Example 1 | A | A | A | A | A | A | A | A | A |
| Example 2 | A | B | A | A | B | A | A | A | A |
| Example 3 | A | C | A | A | C | B | B | A | B |
| Example 4 | A | C | B | B | C | B | C | B | B |
| Example 5 | A | B | B | B | B | A | B | B | A |
| Example 6 | A | A | A | A | A | A | A | A | A |
| Example 7 | B | B | A | A | C | B | B | A | B |
| Example 8 | C | C | A | A | C | B | B | A | C |
| Example 9 | A | A | A | A | A | A | A | A | A |
| Example 10 | B | B | A | A | C | B | B | A | B |
| Example 11 | C | C | A | A | D | B | B | A | C |
| Example 12 | A | B | A | A | B | A | A | A | A |
| Example 13 | A | C | A | B | C | B | C | B | B |
| Example 14 | A | D | A | B | D | B | C | B | C |
| Example 15 | C | D | A | B | D | C | D | B | C |
| Example 16 | A | A | A | A | A | A | A | A | A |
| Example 17 | B | B | A | A | B | A | A | A | B |
| Example 18 | C | C | A | A | C | B | B | A | C |
| Example 19 | D | D | A | A | D | C | C | A | D |
| Example 20 | B | B | A | A | B | A | A | A | B |
| Example 21 | C | C | A | A | C | B | B | A | C |
| Example 22 | D | D | A | A | D | C | C | A | D |
| Example 23 | A | A | A | A | A | A | A | A | A |
| Example 24 | A | A | A | A | A | A | A | A | A |
| Example 25 | C | C | A | A | C | B | B | A | C |
| Example 26 | A | A | A | A | A | A | A | A | A |
| Example 27 | A | A | A | A | A | A | A | A | A |
| Example 28 | A | A | A | A | A | A | A | A | A |
| Example 29 | A | A | A | A | A | A | A | A | A |
| Example 30 | A | A | B | B | A | A | B | B | A |
| Example 31 | A | A | B | B | A | A | B | B | A |
| Example 32 | A | A | A | A | A | A | A | A | A |
| Example 33 | A | A | A | A | A | A | A | A | B |
| Example 34 | A | A | A | A | A | A | A | A | C |
| Example 35 | A | A | A | A | A | A | A | A | D |
| Example 36 | A | A | A | A | A | A | A | A | A |
| Example 37 | A | A | A | A | A | A | A | A | B |
| Example 38 | A | A | A | A | A | A | A | A | C |
| Example 39 | A | A | A | A | A | A | A | A | D |
| Comparative Example 1 | E | E | C | C | E | D | F | C | E |
| Comparative Example 2 | E | E | C | C | E | D | F | C | E |
| Comparative Example 3 | E | E | A | A | E | D | D | A | E |
| Comparative Example 4 | A | E | C | C | E | B | E | C | D |

TABLE 4-continued

| | Arithmetic average roughness (Ra) | Average length (RSm) of profile elements | Odor in molding | Color of end of film | Number of breaks | Number of vapor deposition defects | Time-dependent number of vapor deposition defects | Time-dependent increase of number of vapor deposition defects | Adhesive strength |
|---|---|---|---|---|---|---|---|---|---|
| Comparative Example 5 | E | E | A | A | E | D | D | A | E |
| Comparative Example 6 | E | E | C | C | E | D | F | C | E |
| Comparative Example 7 | A | E | C | B | E | B | E | C | D |
| Comparative Example 8 | E | E | C | B | E | D | F | C | E |

TABLE 5

| | Arithmetic average roughness (Ra) | Average length (RSm) of profile elements | Color of end of film | Number of breaks | Number of vapor deposition defects | Time-dependent number of vapor deposition defects | Time-dependent increase of number of vapor deposition defects | Adhesive strength |
|---|---|---|---|---|---|---|---|---|
| Example 40 | A | A | A | A | A | A | A | A |
| Example 41 | A | B | A | B | A | A | A | A |
| Example 42 | A | C | A | C | B | B | A | B |
| Example 43 | A | C | B | C | B | C | B | B |
| Example 44 | A | B | B | B | A | B | B | A |
| Example 45 | A | A | A | A | A | A | A | A |
| Example 46 | B | B | A | C | B | B | A | B |
| Example 47 | C | C | A | D | B | B | A | C |
| Example 48 | A | A | A | A | A | A | A | A |
| Example 49 | A | A | A | C | B | B | A | B |
| Example 50 | C | C | A | D | B | B | A | C |
| Example 51 | A | B | A | B | A | A | A | A |
| Example 52 | A | C | B | C | B | C | B | B |
| Example 53 | A | D | B | D | B | C | B | C |
| Example 54 | C | D | B | D | C | D | B | C |
| Example 55 | A | A | A | A | A | A | A | A |
| Example 56 | B | B | A | B | A | A | A | B |
| Example 57 | C | C | A | C | B | B | A | C |
| Example 58 | D | D | A | D | C | C | A | D |
| Example 59 | B | B | A | B | A | A | A | B |
| Example 60 | C | C | A | C | B | B | A | C |
| Example 61 | D | D | A | D | C | C | A | D |
| Example 62 | A | A | A | A | A | A | A | A |
| Example 63 | A | A | A | A | A | A | A | A |
| Example 64 | C | C | A | C | B | B | A | C |
| Example 65 | A | A | A | A | A | A | A | A |
| Example 66 | A | A | A | A | A | A | A | A |
| Example 67 | A | A | A | A | A | A | A | A |
| Example 68 | A | A | A | A | A | A | A | A |
| Example 69 | A | A | A | A | A | B | B | A |
| Example 70 | A | A | B | A | A | B | B | A |
| Example 71 | A | A | A | A | A | A | A | A |
| Example 72 | A | A | A | A | A | A | A | B |
| Example 73 | A | A | A | A | A | A | A | C |
| Example 74 | A | A | A | A | A | A | A | D |
| Example 75 | A | A | A | A | A | A | A | A |
| Example 76 | A | A | A | A | A | A | A | B |
| Example 77 | A | A | A | A | A | A | A | C |
| Example 78 | A | A | A | A | A | A | A | D |
| Comparative Example 9 | E | E | C | E | D | F | C | E |
| Comparative Example 10 | E | E | C | E | D | F | C | E |
| Comparative Example 11 | E | E | A | E | D | D | A | E |
| Comparative Example 12 | A | E | C | E | B | E | C | D |
| Comparative Example 13 | E | E | A | E | D | D | A | E |

TABLE 5-continued

| | Arithmetic average roughness (Ra) | Average length (RSm) of profile elements | Color of end of film | Number of breaks | Number of vapor deposition defects | Time-dependent number of vapor deposition defects | Time-dependent increase of number of vapor deposition defects | Adhesive strength |
|---|---|---|---|---|---|---|---|---|
| Comparative Example 14 | E | E | C | E | D | F | C | E |

TABLE 6

| | Arithmetic average roughness (Ra) | Average length (ESm) of profile elements | Odor in molding | Color of end of film | Number of breaks | Number of vapor deposition defects | Time-dependent number of vapor deposition defects | Time-dependent increase of number of vapor deposition defects | Adhesive strength |
|---|---|---|---|---|---|---|---|---|---|
| Example 79 | A | A | A | A | A | A | A | A | A |
| Example 80 | A | B | A | A | B | A | A | A | A |
| Example 81 | A | C | A | A | C | B | B | A | B |
| Example 82 | A | C | B | B | C | B | C | B | B |
| Example 83 | A | B | A | A | B | A | B | B | A |
| Example 84 | A | A | A | A | A | A | A | A | A |
| Example 85 | B | B | A | A | C | B | B | A | B |
| Example 86 | C | C | A | A | D | B | B | A | C |
| Example 87 | A | A | A | A | A | A | A | A | A |
| Example 88 | B | A | A | A | C | B | B | A | B |
| Example 89 | C | C | A | A | D | B | B | A | C |
| Example 90 | A | B | A | A | B | B | A | A | A |
| Example 91 | A | C | A | A | C | B | C | B | B |
| Example 92 | A | D | A | A | D | B | C | B | C |
| Example 93 | C | D | B | B | D | C | D | B | C |
| Example 94 | A | A | A | A | A | A | A | A | A |
| Example 95 | B | B | A | A | B | A | A | A | B |
| Example 96 | C | C | A | A | C | B | B | A | C |
| Example 97 | C | D | A | A | D | C | C | A | B |
| Example 98 | B | B | A | A | B | A | A | A | D |
| Example 99 | C | C | A | A | C | B | B | A | C |
| Example 100 | D | D | A | A | D | C | C | A | D |
| Example 101 | A | A | A | A | A | A | A | A | A |
| Example 102 | A | A | A | A | A | A | A | A | A |
| Example 103 | C | C | A | A | C | B | B | A | C |
| Example 104 | A | A | A | A | A | A | A | A | A |
| Example 105 | A | A | A | A | A | A | A | A | A |
| Example 106 | A | A | A | A | A | A | A | A | A |
| Example 107 | A | A | A | A | A | A | A | A | A |
| Example 108 | A | A | B | B | A | A | B | B | A |
| Example 109 | A | A | B | B | A | A | B | B | A |
| Example 110 | A | A | A | A | A | A | A | A | A |
| Example 111 | A | A | A | A | A | A | A | A | B |
| Example 112 | A | A | A | A | A | A | A | A | C |
| Example 113 | A | A | A | A | A | A | A | A | D |
| Example 114 | A | A | A | A | A | A | A | A | A |
| Example 115 | A | A | A | A | A | A | A | A | B |
| Example 116 | A | A | A | A | A | A | A | A | C |
| Example 117 | A | A | A | A | A | A | A | A | D |
| Comparative Example 15 | E | E | C | C | E | D | F | C | E |
| Comparative Example 16 | E | E | C | C | E | D | F | C | E |
| Comparative Example 17 | E | E | A | A | E | D | D | A | E |
| Comparative Example 18 | A | E | C | C | E | B | E | C | D |
| Comparative Example 19 | E | E | A | A | E | D | D | A | E |
| Comparative Example 20 | E | E | C | C | E | D | F | C | E |
| Comparative Example 21 | A | E | C | C | E | B | E | C | D |
| Comparative Example 22 | E | E | C | C | E | D | F | C | E |

As is clear from the results shown in Tables 4 to 6, the films of Examples are superior in appearance characteristics and film-breaking resistance. In addition, among the laminates, the laminates obtained through vapor deposition of a metal onto a film have less vapor deposition defects and are superior in adhesive strength between the metal vapor deposition layer and the EVOH film layer. On the other hand, the laminates of Comparative Examples in which the content of the inorganic particles (B) or the content of the aliphatic carbonyl compound (C) does not fall within the specified range are inferior in these characteristics.

Synthesis of Vinyl Alcohol Polymer (A1)

Synthesis Example 1

Polymerization was carried out in a 250 L pressure reactor under the following conditions to produce an ethylene-vinyl acetate copolymer.
Amount Charged
vinyl acetate: 91.2 kg
methanol: 31.9 kg
2,2'-azobisisobutyronitrile concentration: 2.0 g/L (methanol solvent)
2,2'-azobisisobutyronitrile feed rate: 828 mL/hr
Polymerization Conditions
polymerization temperature: 60° C.
ethylene pressure in polymerization reactor: 3.59 MPa
polymerization time period: 5.0 hours The rate of polymerization of vinyl acetate in the resulting copolymer was about 40%. After sorbic acid was added to this copolymerization reaction liquid, the liquid was supplied to a purge tower, and after unreacted vinyl acetate was eliminated from the top of the tower by introducing methanol vapor from the bottom of the tower, a 41% methanol solution of an ethylene-vinyl acetate copolymer was obtained. This ethylene-vinyl acetate copolymer had an ethylene content of 32 mol %. This methanol solution of the ethylene-vinyl acetate copolymer was charged into a saponification reactor, and a solution of sodium hydroxide in methanol (80 g/L) was added so as to attain 0.4 equivalents with respect to the vinyl ester component in the copolymer, and methanol was added to adjust the copolymer concentration of 20%. The temperature of this solution was elevated to 60° C., and the reaction was allowed while blowing a nitrogen gas into the reactor for about 4 hours. Then, this solution was extruded from a die plate provided with a circular opening into water to permit deposition, followed by cutting, whereby pellets having a diameter of about 3 mm and a length of about 5 mm were obtained. The pellets thus obtained were subjected to deliquoring using a centrifugal separator, and further an operation of the deliquoring after adding a large amount of water was repeated.

Synthesis Example 2

Pellets were obtained by polymerizing, saponifying, pelletizing and washing in a similar manner to Synthesis Example 1 except that acetone was supplied so as to attain the acetone concentration of 0.5 ppm with respect to vinyl acetate added during the polymerization.

Synthesis Example 3

Pellets were obtained by polymerizing, saponifying, pelletizing and washing in a similar manner to Synthesis Example 1 except that propanal was supplied so as to attain the propanal concentration of 0.5 ppm with respect to vinyl acetate added during the polymerization.

Preparation of Resin Composition

Preparation Example 1

Twenty kg of the pellets obtained in Synthesis Example 1 were placed into 180 kg of a mixed solvent of water and methanol (mass ratio: water/methanol=40/60), and the mixture was stirred at 60° C. for 6 hours to completely dissolve the pellets. To this solution were added 61 mg of acetone and 105 mg of sorbic acid, and the mixture was further stirred for 1 hour such that acetone and sorbic acid were completely dissolved, whereby a resin composition solution was obtained. This resin composition solution was continuously extruded from a nozzle having a diameter of 4 mm into a coagulation bath containing a mixture of water and methanol (mass ratio: water/methanol=90/10) adjusted at 0° C. thereby permitting coagulation so as to give a strand form. This strand was introduced into a pelletizing machine to obtain porous resin composition chips. After these porous resin composition chips were washed with an aqueous acetic acid solution and ion exchanged water, an immersion treatment in an aqueous solution containing acetic acid, sodium acetate, potassium dihydrogen phosphate and boric acid was carried out. The resin composition chips were separated from the aqueous solution for the immersion treatment, followed by deliquoring, and thereafter were dried in a hot-air dryer at 80° C. for 4 hours and further at 100° C. for 16 hours to obtain dry resin composition pellets. The content of the saturated ketone (c-3) in the dry resin composition pellets was quantitatively determined using the aforementioned quantitative determination method. It is to be noted that the resin composition was prepared such that the content of each component was as shown in Table 7 by adjusting the amount of the saturated ketone (c-3) added, and the concentration of each component in the aqueous solution for the immersion treatment. The ethylene content and the degree of saponification in the resin composition were analyzed according to the aforementioned methods, and it was found that the ethylene content was 32.0 mol % and the degree of saponification was 99.98 mol % or greater. Moreover, according to the analyses using the aforementioned methods, the content of acetic acid and the acetic acid ion was 350 ppm, the content of the sodium ion was 100 ppm, the content of the potassium ion was 40 ppm, the content of the magnesium ion was 50 ppm, the content of the phosphorus compound was 100 ppm in terms of phosphate radical equivalent, and the content of the boron compound was 200 ppm in terms of boron element equivalent.

Preparation Example 2

Twenty kg of the pellets obtained in Synthesis Example 2 were placed into 180 kg of a mixed solvent of water and methanol (mass ratio: water/methanol=40/60), and the mixture was stirred at 60° C. for 6 hours to completely dissolve the pellets. To this solution was added 105 mg of sorbic acid, and the mixture was further stirred for 1 hour such that sorbic acid were completely dissolved, whereby a resin composition solution was obtained. This resin composition solution was continuously extruded from a nozzle having a diameter of 4 mm into a coagulation bath containing a mixture of water and methanol (mass ratio: water/methanol=90/10) adjusted at 0° C. thereby permitting coagulation so as to give a strand form. This strand was introduced into a pelletizing machine to obtain porous resin composition chips. After these porous resin composition chips were washed with an aqueous acetic acid solution and ion exchanged water, an immersion treatment in an aqueous solution containing acetic acid, sodium acetate, potassium dihydrogen phosphate and boric acid was carried out. The resin composition chips were separated from the aqueous solution for the immersion treatment, followed by deliquoring, and thereafter were dried in a hot-air dryer at 80° C. for 4 hours and further at 100° C. for 16 hours to obtain dry resin composition pellets. It is to be noted that the content of acetone in this resin composition was less than the detection lower limit.

Preparation Example 3

Twenty kg of the pellets obtained in Synthesis Example 1 were placed into 180 kg of a mixed solvent of water and methanol (mass ratio: water/methanol=40/60), and the mixture was stirred at 60° C. for 6 hours to completely dissolve the pellets. To this solution were added 61 mg of propanal and 105 mg of sorbic acid, and the mixture was further stirred for 1 hour such that the saturated aldehyde (c-1) and sorbic acid were completely dissolved, whereby a resin composition solution was obtained. This resin composition solution was continuously extruded from a nozzle having a diameter of 4 mm into a coagulation bath containing a mixture of water and methanol (mass ratio: water/methanol=90/10) adjusted at 0° C. thereby permitting coagulation so as to give a strand form. This strand was introduced into a pelletizing machine to obtain porous resin composition chips. After these porous resin composition chips were washed with an aqueous acetic acid solution and ion exchanged water, an immersion treatment in an aqueous solution containing acetic acid, sodium acetate, magnesium acetate, potassium dihydrogen phosphate and boric acid was carried out. The resin composition chips were separated from the aqueous solution for the immersion treatment, followed by deliquoring, and thereafter were dried in a hot-air dryer at 80° C. for 4 hours and further at 100° C. for 16 hours to obtain dry resin composition pellets. The content of the saturated aldehyde (c-1) in the dry resin composition pellets was quantitatively determined using the aforementioned quantitative determination method. It is to be noted that the resin composition was prepared such that the content of each component was as shown in Table 9 by adjusting the amount of the saturated aldehyde (c-1) added, and the concentration of each component in the aqueous solution for the immersion treatment. The ethylene content and the degree of saponification in the resin composition were analyzed according to the aforementioned methods, and it was found that the ethylene content was 32.0 mol % and the degree of saponification was 99.98 mol % or greater. Moreover, according to the analyses using the aforementioned methods, the content of acetic acid and acetic acid ion was 350 ppm, the content of the sodium ion was 100 ppm, the content of the potassium ion was 40 ppm, the content of the magnesium ion was 50 ppm, the content of the phosphorus compound was 100 ppm in terms of phosphate radical equivalent, and the content of the boron compound was 200 ppm in terms of boron element equivalent.

Preparation Example 4

Twenty kg of the pellets obtained in Synthesis Example 3 were placed into 180 kg of a mixed solvent of water and methanol (mass ratio: water/methanol=40/60), and the mixture was stirred at 60° C. for 6 hours to completely dissolve the pellets. To this solution was added 105 mg of sorbic acid, and the mixture was further stirred for 1 hour such that sorbic acid were completely dissolved, whereby a resin composition solution was obtained. This resin composition solution was continuously extruded from a nozzle having a diameter of 4 mm into a coagulation bath containing a mixture of water and methanol (mass ratio: water/methanol=90/10) adjusted at 0° C. thereby permitting coagulation so as to give a strand form. This strand was introduced into a pelletizing machine to obtain porous resin composition chips. After these porous resin composition chips were washed with an aqueous acetic acid solution and ion exchanged water, an immersion treatment in an aqueous solution containing acetic acid, sodium acetate, potassium dihydrogen phosphate and boric acid was carried out. The resin composition chips were separated from the aqueous solution for the immersion treatment, followed by deliquoring, and thereafter were dried in a hot-air dryer at 80° C. for 4 hours and further at 100° C. for 16 hours to obtain dry resin composition pellets. It is to be noted that the content of propanal in the resin composition was less than the detection lower limit.

Preparation of Laminate (Vapor-Deposited Film)

Example 118

Preparation of Base Film

Acetone and synthetic silica ("Sylysia 310P" available from Fuji Silysia Chemical Ltd.; the mean particle diameter as determined using a laser technique: 2.7 μm) were dry-blended with the resin composition obtained in Preparation Example 1 using a tumbler such that the amount of acetone was 2.9 ppm and the amount of the synthetic silica was 0.03 parts by mass with respect to 100 parts by mass of the resin composition obtained in Preparation Example 1. Thereafter, the mixture was melted at 240° C., and extruded from a die onto a casting roll concurrently with blowing an air toward the extrudate at a wind velocity of 30 m/sec with an air knife to obtain an unstretched film having a thickness of 170 μm. This film was brought into contact with hot water at 80° C. for 10 sec, stretched 3.2-fold along a machine direction and 3.0-fold along a transverse direction at 90° C. using a tenter type simultaneous biaxial stretching apparatus, and further heat-treated for 5 sec in a tenter conditioned at 170° C. to obtain a biaxially-stretched hot film (base film) having an entire width of 3.6 m. This film was slit over a width of 80 cm centering the middle point of the entire width of the film while rewinding the base film, whereby a 4,000 m-long roll was obtained. Furthermore, base films were continuously formed, and one hundred of 4,000 m-long rolls in total were obtained. The base film thus obtained contained 0.15% by mass of volatile matter. In addition, any odor was not recognized during the preparation of the base film. These base films were wrapped in an aluminum-foil-laminated film in order to prevent moisture absorption.

Formation of Vapor Deposition Layer

Using the base film, aluminum was vapor-deposited on one side of the biaxially stretched film using a batch-wise vapor deposition equipment ("EWA-105" available from ULVAC, Inc.) at a surface temperature of the biaxially stretched film of 38° C. and at a travelling speed of the biaxially stretched film of 200 m/min, whereby a vapor-deposited film was obtained. The thickness of aluminum of the vapor deposition layer was 70 nm. The vapor deposition defects and the adhesive strength of the vapor deposition layer in the resulting vapor-deposited film were each evaluated as being favorable. The content of the volatile matter in the vapor-deposited film was identical in all the rolls, and evaluated as being favorable.

Examples 119 to 122 and 125 to 131, and Comparative Examples 25 and 26

A vapor-deposited film was prepared in a similar manner to Example 118 except that the content of acetone, the surface temperature of the base film in the vapor deposition, and the thickness of the vapor deposition layer were changed as shown in Table 7. It is to be noted that no odor or a faint odor was recognized during the formation of the base films of Examples 119 to 122. On the other hand, an odor was clearly recognized during the formation of the base films of Comparative Examples 25 and 26.

Further, with respect to the vapor-deposited film thus obtained, the content of the volatile matter in the vapor-deposited film was determined, and additionally evaluations of the vapor deposition defects and the adhesive strength of the vapor deposition layer were made. These results are shown in Table 7. In Examples 119 to 122 and 125 to 131, favorable results were obtained in regard to the vapor deposition defects and the adhesive density of the vapor deposition layer. On the other hand, in Comparative Examples 25 and 26, favorable results were not obtained in regard to the vapor deposition defects and the adhesive density of the vapor deposition layer.

Example 123

A vapor-deposited film was prepared in a similar manner to Example 118 except that a biaxially stretched film (base film) was prepared using methyl ethyl ketone in place of acetone as the saturated ketone (c-3). It is to be noted that any odor was not recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 7. In Example 123, favorable results were obtained in regard to all of the evaluation items.

Example 124

A vapor-deposited film was prepared in a similar manner to Example 118 except that a biaxially stretched film (base film) was prepared using 2-hexanone in place of acetone as the saturated ketone (c-3). It is to be noted that any odor was not recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 7. In Example 124, favorable results were obtained in regard to all of the evaluation items.

Example 132

Using the biaxially stretched film obtained in a similar manner to Example 118, a vapor deposition layer was formed on the other side of the biaxially stretched film, whereby a vapor-deposited film was obtained. Conditions for the formation of the vapor deposition layer were identical to those in Example 118. It is to be noted that any odor was not recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 7. In Example 132, favorable results were obtained in regard to all of the evaluation items.

Comparative Example 23

A vapor-deposited film was prepared in a similar manner to Example 118 except that the resin composition obtained in Preparation Example 2 was used and the saturated ketone (c-3) was not added. It is to be noted that a somewhat strong odor was recognized during the formation of the base film. With respect to the vapor-deposited film thus obtained, the volatile matter in the vapor-deposited film was determined, and additionally evaluations of the vapor deposition defects and the adhesive strength of the vapor deposition layer were made. These results are shown in Table 7. In Comparative Example 23, favorable results were not obtained in regard to any of the evaluation items.

Comparative Example 24

A vapor-deposited film was prepared in a similar manner to Comparative Example 23 except that 0.15% by mass of volatile matter was contained in the base film. It is to be noted that a somewhat strong odor was recognized during the formation of the base film. With respect to the vapor-deposited film thus obtained, evaluations of the number of vapor deposition defects and the adhesive strength of the vapor deposition layer were made. These results are shown in Table 7. In Comparative Example 24, favorable results were not obtained in regard to any of the evaluation items.

TABLE 7

| | Saturated ketone type | Saturated ketone content (ppm) | Volatile matter (%) | Film surface temperature (° C.) | Vapor deposition thickness (nm) | Evaluations odor in film molding | Evaluations number of vapor deposition defects | Evaluations adhesive strength |
|---|---|---|---|---|---|---|---|---|
| Example 118 | acetone | 2.9 | 0.15 | 38 | 70 | A | A | A |
| Example 119 | acetone | 0.13 | 0.15 | 38 | 70 | A | A | A |
| Example 120 | acetone | 48 | 0.15 | 43 | 70 | B | B | B |
| Example 121 | acetone | 98 | 0.15 | 48 | 70 | B | B | B |
| Example 122 | acetone | 0.07 | 0.15 | 53 | 70 | A | B | C |

TABLE 7-continued

| | Saturated ketone | | Volatile matter (%) | Film surface temperature (° C.) | Vapor deposition thickness (nm) | Evaluations | | |
|---|---|---|---|---|---|---|---|---|
| | type | content (ppm) | | | | odor in film molding | number of vapor deposition defects | adhesive strength |
| Example 123 | methyl ethyl ketone | 48 | 0.45 | 53 | 70 | B | B | C |
| Example 124 | 2-hexanone | 48 | 0.70 | 53 | 70 | B | B | D |
| Example 125 | acetone | 2.9 | 0.95 | 53 | 70 | A | B | D |
| Example 126 | acetone | 2.9 | 1.05 | 30 | 70 | A | A | C |
| Example 127 | acetone | 2.9 | 0.15 | 38 | 95 | A | A | B |
| Example 128 | acetone | 2.9 | 0.15 | 38 | 50 | A | A | A |
| Example 129 | acetone | 2.9 | 0.15 | 38 | 25 | A | A | B |
| Example 130 | acetone | 2.9 | 1.05 | 53 | 70 | A | C | D |
| Example 131 | acetone | 2.9 | 1.05 | 38 | 70 | A | B | B |
| Example 132 | acetone | 2.9 | 0.15 | 38 (principal surface side) 40 (ether principal surface side) | 70 70 | A | A | A (principal surface side) A (ether principal surface side) |
| Comparative Example 23 | acetone | N.D.*[1] | 1.05 | 53 | 70 | D | D | E |
| Comparative Example 24 | acetone | N.D.*[1] | 0.15 | 53 | 70 | D | D | E |
| Comparative Example 25 | acetone | 200 | 0.15 | 62 | 70 | E | D | E |
| Comparative Example 26 | acetone | 500 | 0.15 | 62 | 70 | E | E | E |

N.D.*[1]: the content of the saturated ketone was less than the detection lower limit (0.01 ppm)

As shown in Table 7, the base films containing the vinyl alcohol polymer (A1) and a specific amount of the saturated ketone (c-3) therein and the vapor-deposited films including these base films were able to inhibit vapor deposition voids that would be generated during the vapor deposition and additionally were superior in adhesive strength.

Example 133

A PET film ("E5000" available from Toyobo Co., Ltd.; thickness: 12 μm) was laminated on one side of the vapor-deposited film of Example 118, and additionally an unstretched polypropylene film (CPP film) ("RXC-21" available from Mitsui Chemicals Tohcello Inc.; thickness: 50 μm) was laminated on the other side of the vapor-deposited film, whereby a laminated film was obtained. The oxygen transmission rate of this laminated film was measured. The result is shown in Table 8.

Examples 134 to 136 and Comparative Example 27

A laminated film was prepared in a similar manner to Example 133 except that the layer structure was as shown in Table 8, and the oxygen transmission rate thereof was measured. The results are shown in Table 8. It is to be noted that "VM-PET 1510" (thickness: 12 μm) available from Toray Advanced Film Co., Ltd. was used as the vapor-deposited PET film shown in Table 8.

TABLE 8

| | Layer structure | Oxygen transmission rate |
|---|---|---|
| Example 133 | PET film/vapor-deposited film of Example 118/CPP film | 0.09 |
| Example 134 | vapor-deposited PET film/vapor-deposited film of Example 118/CPP film | 0.04 |
| Example 135 | PET film/vapor-deposited film of Example 118/vapor-deposited film of Example 118/CPP film | <0.01 |
| Example 136 | PET film/vapor-deposited film of Example 132/CPP film | <0.01 |
| Comparative Example 27 | PET film/vapor-deposited film of Comparative Example 23/CPP film | 0.34 |

As shown in Table 8, the laminated films of Examples 133 to 136 exhibited a lower oxygen transmission rate and were more superior in gas barrier properties as compared with the laminated film of Comparative Example 27.

Preparation of Laminate (Vapor-Deposited Film)

Example 137

Propanal and synthetic silica ("Sylysia 310P" available from Fuji Silysia Chemical Ltd.; the mean particle diameter as determined using a laser technique: 2.7 μm) were dry-blended with the resin composition obtained in Preparation Example 3 using a tumbler such that the amount of propanal was 2.9 ppm and the amount of the synthetic silica was 0.03 parts by mass with respect to 100 parts by mass of the resin composition obtained in Preparation Example 3. Thereafter, the mixture was melted at 240° C., and extruded from a die onto a casting roll concurrently with blowing an air toward the extrudate at a wind velocity of 30 m/sec with an air knife to obtain an unstretched film having a thickness of 170 μm. This film was brought into contact with hot water at 80° C. for 10 sec, stretched 3.2-fold along a machine direction and 3.0-fold along a transverse direction at 90° C. using a tenter type simultaneous biaxial stretching apparatus, and further heat-treated for 5 sec in a tenter conditioned at 170° C. to obtain a biaxially-stretched hot film (base film) having an entire width of 3.6 m. This film was slit over a width of 80 cm centering the middle point of the entire width of the film while rewinding the base film, whereby a 4,000 m-long roll was obtained. Furthermore, base films were continuously formed, and one hundred of 4,000 m-long rolls in total were obtained. The base film thus obtained contained 0.15% by mass of volatile matter. In addition, any odor was not recognized during the preparation of the base film. These base films were wrapped in an aluminum-foil-laminated film in order to prevent moisture absorption.

Formation of Vapor Deposition Layer

Using the base film, aluminum was vapor-deposited on one side of the biaxially stretched film using a batch-wise vapor deposition equipment ("EWA-105" available from ULVAC, Inc.) at a surface temperature of the biaxially stretched film of 38° C. and at a travelling speed of the biaxially stretched film of 200 m/min, whereby a vapor-deposited film was obtained. The thickness of aluminum of the vapor deposition layer was 70 nm. The vapor deposition defects and the adhesive strength of the vapor deposition layer in the resulting vapor-deposited film were each evaluated as being favorable. The content of the volatile matter in the vapor-deposited film was identical in all the rolls, and evaluated as being favorable.

Examples 138 to 141 and 144 to 150, and Comparative Examples 30 and 31

A vapor-deposited film was prepared in a similar manner to Example 137 except that the content of propanal, the surface temperature of the base film in the vapor deposition, and the thickness of the vapor deposition layer were changed as shown in Table 9. It is to be noted that no odor or a faint odor was recognized during the formation of the base films of Examples 138 to 141. On the other hand, an odor was clearly recognized during the formation of the base films of Comparative Examples 30 and 31.

Further, with respect to the vapor-deposited film thus obtained, the content of the volatile matter in the vapor-deposited film was determined, and additionally evaluations of the vapor deposition defects and the adhesive strength of the vapor deposition layer were made. These results are shown in Table 9. In Examples 138 to 141 and 144 to 150, favorable results were obtained in regard to the vapor deposition defects and the adhesive density of the vapor deposition layer. On the other hand, in Comparative Examples 30 and 31, favorable results were not obtained in regard to the vapor deposition defects and the adhesive density of the vapor deposition layer.

Example 142

A vapor-deposited film was prepared in a similar manner to Example 137 except that a biaxially stretched film (base film) was prepared using butanal in place of propanal as the saturated aldehyde (c-1). It is to be noted that any odor was not recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 9. In Example 142, favorable results were obtained in regard to all of the evaluation items.

Example 143

A vapor-deposited film was prepared in a similar manner to Example 137 except that a biaxially stretched film (base film) was prepared using hexanal in place of propanal as the saturated aldehyde (c-1). It is to be noted that any odor was not recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 9. In Example 143, favorable results were obtained in regard to all of the evaluation items.

Example 151

Using the biaxially stretched film obtained in a similar manner to Example 137, a vapor deposition layer was formed on the other side of the biaxially stretched film, whereby a vapor-deposited film was obtained. Conditions for the formation of the vapor deposition layer were identical to those in Example 137. It is to be noted that any odor was not recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 9. In Example 151, favorable results were obtained in regard to all of the evaluation items.

Comparative Example 28

A vapor-deposited film was prepared in a similar manner to Example 137 except that the resin composition obtained in Preparation Example 4 was used and the saturated aldehyde (c-1) was not added. It is to be noted that an odor was clearly recognized during the formation of the base film. With respect to the vapor-deposited film thus obtained, the content of the volatile matter in the vapor-deposited film was determined, and additionally evaluations of the vapor deposition defects and the adhesive strength of the vapor deposition layer were made. These results are shown in Table 9. In Comparative Example 28, favorable results were not obtained in regard to any of the evaluation items.

Comparative Example 29

A vapor-deposited film was prepared in a similar manner to Comparative Example 28 except that 0.15% by mass of volatile matter was contained in the base film. It is to be noted that an odor was clearly recognized during the formation of the base film. With respect to the vapor-deposited film thus obtained, evaluations of the number of vapor deposition defects and the adhesive strength of the vapor deposition layer were made. These results are shown in Table 9. In Comparative Example 29, favorable results were not obtained in regard to any of the evaluation items.

Examples 153 to 155 and Comparative Example 32

A laminated film was prepared in a similar manner to Example 152 except that the layer structure was as shown in Table 10, and the oxygen transmission rate thereof was measured. The results are shown in Table 10. It is to be noted that "VM-PET 1510" (thickness: 12 μm) available from Toray Advanced Film Co., Ltd. was used as the vapor-deposited PET film shown in Table 10.

TABLE 9

| | Saturated aldehyde | | Volatile | Film | Vapor | Evaluation | | |
| | | | | surface | deposition | odor in | number of vapor | |
| | type | content (ppm) | matter (%) | temperature (° C.) | thickness (nm) | film molding | deposition defects | adhesive strength |
|---|---|---|---|---|---|---|---|---|
| Example 137 | propanal | 2.9 | 0.15 | 38 | 70 | A | A | A |
| Example 138 | propanal | 0.13 | 0.15 | 38 | 70 | A | A | A |
| Example 139 | propanal | 48 | 0.15 | 43 | 70 | B | B | B |
| Example 140 | propanal | 98 | 0.15 | 48 | 70 | B | B | B |
| Example 141 | propanal | 0.07 | 0.15 | 53 | 70 | A | B | C |
| Example 142 | butanal | 48 | 0.45 | 53 | 70 | B | B | C |
| Example 143 | hexanal | 48 | 0.7 | 53 | 70 | B | B | D |
| Example 144 | propanal | 2.9 | 0.95 | 53 | 70 | A | B | D |
| Example 145 | propanal | 2.9 | 1.05 | 38 | 70 | A | A | C |
| Example 146 | propanal | 2.9 | 0.15 | 38 | 95 | A | A | B |
| Example 147 | propanal | 2.9 | 0.15 | 38 | 50 | A | A | A |
| Example 148 | propanal | 2.9 | 0.15 | 38 | 25 | A | A | B |
| Example 149 | propanal | 2.9 | 1.05 | 53 | 70 | A | C | D |
| Example 150 | propanal | 2.9 | 1.05 | 38 | 70 | A | B | B |
| Example 151 | propanal | 2.9 | 0.15 | 38 (principal surface side) | 70 | A | A | A (principal surface side) |
| | | | | 40 (other principal surface side) | 70 | | | A (other principal surface side) |
| Comparative Example 28 | propanal | N.D. | 1.05 | 53 | 70 | C | D | E |
| Comparative Example 29 | propanal | N.D. | 0.15 | 53 | 70 | C | D | E |
| Comparative Example 30 | propanal | 200 | 0.15 | 62 | 70 | C | D | E |
| Comparative Example 31 | propanal | 500 | 0.15 | 62 | 70 | C | E | E |

N.D.*[1]: less than the detection lower limit (0.01 ppm)

As shown in Table 9, the base films containing the vinyl alcohol polymer (A1) and a specific amount of the saturated aldehyde (c-1) therein and the vapor-deposited films including these base films were able to inhibit vapor deposition voids that would be generated during the vapor deposition and additionally were superior in adhesive strength.

Example 152

A PET film ("E5000" available from Toyobo Co., Ltd.; thickness: 12 μm) was laminated on one side of the vapor-deposited film of Example 137, and additionally an unstretched polypropylene film (CPP film) ("RXC-21" available from Mitsui Chemicals Tohcello Inc.; thickness: 50 μm) was laminated on the other side of the vapor-deposited film, whereby a laminated film was obtained. The oxygen transmission rate of this laminated film was measured. The result is shown in Table 10.

TABLE 10

| | Layer structure | Oxygen transmission rate |
|---|---|---|
| Example 152 | PET film/vapor-deposited film of Example 137/CPP film | 0.09 |
| Example 153 | vapor-deposited PET film/vapor-deposited film of Example 137/CPP film | 0.04 |
| Example 154 | PET film/vapor-deposited film of Example 137/vapor-deposited film of Example 137/CPP film | <0.01 |
| Example 155 | PET film/vapor-deposited film of Example 151/CPP film | <0.01 |

TABLE 10-continued

| | Layer structure | Oxygen transmission rate |
|---|---|---|
| Comparative Example 32 | PET film/vapor-deposited film of Comparative Example 28/CPP film | 0.34 |

As shown in Table 10, the laminated films of Examples 152 to 155 exhibited a lower oxygen transmission rate and were more superior in gas barrier properties as compared with the laminated film of Comparative Example 32.

Synthesis of Vinyl Alcohol Polymer (A2)

Synthesis Example 4

Polymerization was carried out in a 250 L pressure reactor under the following conditions to produce an ethylene-vinyl acetate copolymer.
Amount Charged
vinyl acetate: 83.0 kg
methanol: 26.6 kg
2,2'-azobisisobutyronitrile feed rate: 1119.5 mL/hr (concentration: 1.5 g/L)
Polymerization Conditions
polymerization temperature: 60° C.
ethylene pressure in polymerization reactor: 4.93 MPa
polymerization time period: 5.0 hours The rate of polymerization of vinyl acetate in the resulting copolymer was about 40%. After sorbic acid was added to this copolymerization reaction liquid, the liquid was supplied to a purge tower, and after unreacted vinyl acetate was eliminated from the top of the tower by introducing methanol vapor from the bottom of the tower, a 41% methanol solution of an ethylene-vinyl acetate copolymer was obtained. This ethylene-vinyl acetate copolymer had an ethylene content of 32 mol %. This methanol solution of the ethylene-vinyl acetate copolymer was charged into a saponification reactor, and a solution of sodium hydroxide in methanol (80 g/L) was added so as to attain 0.4 equivalents with respect to the vinyl ester component in the copolymer, and methanol was added to adjust the copolymer concentration of 20%. The temperature of this solution was elevated to 60° C., and the reaction was allowed while blowing a nitrogen gas into the reactor for about 4 hours. Then, this solution was extruded from a die plate provided with a circular opening into water to permit deposition, followed by cutting, whereby pellets having a diameter of about 3 mm and a length of about 5 mm were obtained. The pellets thus obtained were subjected to deliquoring using a centrifugal separator, and further an operation of the deliquoring after adding a large amount of water was repeated.

Twenty kg of the pellets obtained after deliquoring were placed into 180 kg of a mixed solvent of water and methanol (mass ratio: water/methanol=40/60), and the mixture was stirred at 60° C. for 6 hours to completely dissolve the pellets. To this solution were added the unsaturated aldehyde (c-2) and sorbic acid, and the mixture was further stirred for 1 hour such that the unsaturated aldehyde (c-2) and sorbic acid were completely dissolved, whereby a resin composition solution was obtained. This resin composition solution was continuously extruded from a nozzle having a diameter of 4 mm into a coagulation bath containing a mixture of water and methanol (mass ratio: water/methanol=90/10) adjusted at 0° C. thereby permitting coagulation so as to give a strand form. This strand was introduced into a pelletizing machine to obtain porous resin composition chips. After the resulting porous resin composition chips were washed with an aqueous acetic acid solution and ion exchanged water, an immersion treatment in an aqueous solution containing acetic acid, sodium acetate, potassium dihydrogen phosphate and boric acid was carried out. The resin composition chips were separated from the aqueous solution for the immersion treatment, followed by deliquoring, and thereafter were dried in a hot-air dryer at 80° C. for 4 hours and further at 100° C. for 16 hours to obtain dry resin composition pellets. The content of each component in the obtained resin composition was quantitatively determined using the aforementioned quantitative determination methods. It is to be noted that each resin composition was prepared such that the content of each component was as shown in Table 11 by adjusting the amount of the unsaturated aldehyde (c-2) added, and the concentration of each component in the aqueous solution for the immersion treatment.

Synthesis Example 5

Pellets were obtained by polymerizing, saponifying, pelletizing and washing in a similar manner to Synthesis Example 4 except that crotonaldehyde was supplied so as to coexist at 0.5 ppm in the whole system during the polymerization. Twenty kg of the pellets thus obtained were placed into 180 kg of a mixed solvent of water and methanol (mass ratio: water/methanol=40/60), and the mixture was stirred at 60° C. for 6 hours to completely dissolve the pellets. To the solution thus obtained were added the unsaturated aldehyde (c-2) and sorbic acid, and the mixture was further stirred for 1 hour such that the unsaturated aldehyde (c-2) and sorbic acid were completely dissolved, whereby a resin composition solution was obtained. This resin composition solution was continuously extruded from a nozzle having a diameter of 4 mm into a coagulation bath containing a mixture of water and methanol (mass ratio: water/methanol=90/10) adjusted at 0° C. thereby permitting coagulation so as to give a strand form. This strand was introduced into a pelletizing machine to obtain porous resin composition chips. After the resulting porous resin composition chips were washed with an aqueous acetic acid solution and ion exchanged water, an immersion treatment in an aqueous solution containing acetic acid, sodium acetate, potassium dihydrogen phosphate and boric acid was carried out. The resin composition chips were separated from the aqueous solution for the immersion treatment, followed by deliquoring, and thereafter were dried in a hot-air dryer at 80° C. for 4 hours and further at 100° C. for 16 hours to obtain a resin composition (dry resin composition pellets). The content of each component in the obtained resin composition was quantitatively determined using the aforementioned quantitative determination methods. It is to be noted that the content of the unsaturated aldehyde (c-2) in the resin composition obtained in Synthesis Example 5 was less than the detection lower limit.

Example 156

(1) Production of Base Film

Crotonaldehyde and synthetic silica ("Sylysia" 310P; the mean particle diameter as determined using a laser technique: 2.7 μm) manufactured by Fuji Silysia Chemical Ltd. were dry-blended with the resin composition obtained in Synthesis Example 4 using a tumbler such that the amount of crotonaldehyde was 2.9 ppm and the amount of the synthetic silica was 0.03 parts by mass with respect to 100 parts by mass of the resin composition obtained in Synthesis Example 4. Thereafter, the mixture was melted at 240° C., and extruded from a die onto a casting roll concurrently with blowing an air toward the extrudate at a wind velocity of 30 m/sec with an air knife to obtain an unstretched film having a thickness of 170 μm. This film was brought into contact with hot water at 80° C. for 10 sec, stretched 3.2-fold along a machine direction and 3.0-fold along a transverse direction at 90° C. using a tenter type simultaneous biaxial stretching apparatus, and further heat-treated for 5 sec in a tenter conditioned at 170° C. to obtain a stretched and heat-treated film having an entire width of 3.6 m. This film was slit over a width of 80 cm centering the middle point of the entire width of the film while rewinding the film, whereby a 4,000 m-long roll was obtained. Furthermore, base films were continuously formed, and one hundred of 4,000 m-long rolls in total were obtained.

In this Example, 0.15% by mass of volatile matter was contained. In order to prevent moisture absorption, the biaxially stretched film containing a reduced amount of the volatile matter was quickly wrapped in an aluminum-foil-laminated film after the formation thereof.

Using the aforementioned film as a base material, aluminum was vapor-deposited on one side of the film using a batch-wise vapor deposition equipment EWA-105 manufactured by ULVAC, Inc. at a film surface temperature of 38° C. and at a film travelling speed of 200 m/min, whereby a vapor-deposited film was obtained. The thickness of the vapor-deposited aluminum was 70 nm. Furthermore, each of one hundred of 4,000 m-long rolls continuously formed was processed into a vapor-deposited film. Evaluations were made on the first roll and the hundredth roll of the vapor-deposited film for the number of vapor deposition defects, the adhesive strength and the oxygen transmission rate (OTR). The number of vapor deposition defects, the time-dependent change of the number of vapor deposition defects, the adhesive strength of the vapor deposition layer, the time-dependent change of the adhesive strength of the vapor deposition layer of the obtained vapor-deposited film were each favorable. Volatile matter in the vapor-deposited film was identical among the all rolls, and favorable.

Examples 157 to 168

A vapor-deposited film was prepared in a similar manner to Example 156 except that the content of the unsaturated aldehyde (c-2), the film surface temperature in the vapor deposition and the thickness of the vapor deposition layer were changed as shown in Table 11. Then, evaluations of the number of vapor deposition defects, the time-dependent change of the number of vapor deposition defects, the volatile matter in the vapor-deposited film, adhesive strength of a vapor deposition layer, the time-dependent change of the adhesive strength of the vapor deposition layer were made. The results of these evaluations are shown in Table 11. Favorable performances were found in regard to each evaluation item.

Example 169

Using the film obtained in Example 156 as a base material, aluminum was vapor-deposited on one side of the film using a batch-wise vapor deposition equipment EWBA-105 manufactured by ULVAC, Inc. at a film surface temperature of 38° C. and at a film travelling speed of 200 m/min, whereby a vapor-deposited film was obtained. After the film was sufficiently cooled to room temperature, aluminum was vapor-deposited again on the side opposite to the side previously subjected to the aluminum vapor deposition, using a batch-wise vapor deposition equipment EWA-105 manufactured by ULVAC, Inc. at a film surface temperature of 38° C. and at a film travelling speed of 200 m/min, whereby a vapor-deposited film having the vapor-deposited aluminum on both sides was obtained. The thickness of the vapor-deposited aluminum was 70 nm on both sides. Evaluations of the number of vapor deposition defects, the time-dependent change of the number of vapor deposition defects, the adhesive strength of the vapor deposition layer, and the time-dependent change of the adhesive strength of the vapor deposition layer were made in a similar manner to Example 156, and the results thereof are shown in Table 11.

Example 170

Using the film obtained in Example 156 as a base material, aluminum was vapor-deposited on one side of the film using a batch-wise vapor deposition equipment EWA-105 manufactured by ULVAC, Inc. at a film surface temperature of 38° C. and at a film travelling speed of 200 m/min, whereby a vapor-deposited film was obtained. After the film was sufficiently cooled to room temperature, aluminum was vapor-deposited again on the side previously subjected to the aluminum vapor deposition, using a batch-wise vapor deposition equipment EWA-105 manufactured by ULVAC, Inc. at a film surface temperature of 38° C. and at a film travelling speed of 200 m/min, whereby a two-layered vapor-deposited film was obtained. The thickness of the vapor-deposited aluminum was 70 nm on both layers. Evaluations of the number of vapor deposition defects, the time-dependent change of the number of vapor deposition defects, the adhesive strength of the vapor deposition layer, and the time-dependent change of the adhesive strength of the vapor deposition layer were made in a similar manner to Example 156, and the results thereof are shown in Table 11.

Example 171

Using the vapor-deposited film obtained in Example 156, an unstretched polypropylene film having a thickness of 50 m (CPP; RXC-21 manufactured by Mitsui Chemicals Tohcello Inc.) and a stretched polyester film having a thickness of 12 μm (PET; "Lumirror" P60 manufactured by Toray Industries, Inc.) were laminated on the vapor-deposited film obtained in Example 156 with an adhesive through dry lamination, whereby a multilayer film was obtained. The layer structure of this multilayer film was stretched polyester film/vapor-deposited film/unstretched polypropylene film, and the lamination was carried out such that the vapor deposition layer side of the vapor-deposited film was situated on the stretched polyester film side. "TAKELAC" A-385/"TAKENATE" A-50 available from Mitsui Chemicals, Inc. was used as the adhesive, the amount of the adhesive applied was 4 g/m$^2$ in terms of solid content, and drying was carried out at 50° C. for 5 sec. After the drying, aging was further conducted at 40° C. for 3 days. The oxygen transmission rate (OTR) of this multilayer film was measured to be 0.09 mL/m$^2$·day·atm.

Example 172

Using the vapor-deposited film obtained in Example 156, an unstretched polypropylene film having a thickness of 50

μm (CPP; RXC-21 available from Mitsui Chemicals Tohcello Inc.), and a vapor-deposited and stretched polyester film (vapor-deposited PET; "VM-PET" 1510 manufactured by Toray Industries, Inc.) having a thickness of 12 μm, a multilayer film was prepared in a similar manner to Example 171. It is to be noted that this multilayer film was prepared by attaching the vapor deposition surface of the vapor-deposited PET to the vapor deposition surface of the vapor-deposited film. The oxygen transmission rate was measured to be 0.04 mL/m$^2$·day·atm.

Example 173

The vapor-deposited film obtained in Example 156, as well as the unstretched polypropylene film and the stretched polyester film each used in Example 171 were laminated in a similar manner to Example 175, whereby a multilayer film having a stretched polyester film/vapor-deposited film/vapor-deposited film/unstretched polypropylene film structure was prepared. The lamination was made such that the vapor deposition layer side of the vapor-deposited film was situated on the stretched polyester film side. It is to be noted that in laminating the vapor-deposited films, the base film and the vapor deposition layer were attached to each other. The oxygen transmission rate was measured to be less than the detection lower limit (i.e., less than 0.01 mL/m$^2$·day·atm).

Example 174

The vapor-deposited film obtained in Example 169, as well as the unstretched polypropylene film and the stretched polyester film each used in Example 171 were laminated in a similar manner to Example 175, whereby a multilayer film having a stretched polyester film/bilaterally vapor-deposited film/unstretched polypropylene film structure was prepared. The oxygen transmission rate was measured to be 0.03 mL/m$^2$·day·atm.

Example 175

The vapor-deposited film obtained in Example 170, as well as the unstretched polypropylene film and the stretched polyester film each used in Example 171 were laminated in a similar manner to Example 175, whereby a multilayer film having a stretched polyester film/two-layered vapor-deposited film/unstretched polypropylene film structure was prepared. It is to be noted that this multilayer film was prepared by attaching the PET to the vapor deposition surface of the two-layered vapor-deposited film. The oxygen transmission rate was 0.03 mL/m$^2$·day·atm.

Example 176

The vapor-deposited film obtained in Example 156, as well as the unstretched polypropylene film and the vapor-deposited and stretched polyester film each used in Example 172, and the stretched polyamide film (ON; "Emblem" ONBC (trademark) manufactured by Unitika Ltd.) having a thickness of 15 μm were laminated in a similar manner to Example 175, whereby a multilayer film having a stretched polyamide film/vapor-deposited and stretched polyester film/vapor-deposited film/unstretched polypropylene film structure was prepared. It is to be noted that this multilayer film was prepared by attaching the vapor deposition surface of the vapor-deposited PET to the vapor deposition surface of the vapor-deposited film. The oxygen transmission rate was measured to be 0.04 mL/m$^2$·day·atm.

Comparative Example 33

The unsaturated aldehyde (c-2) was not added to the resin composition obtained in Synthesis Example 5. The content of the volatile matter in the base film before the vapor deposition was 1.05% by mass. A vapor-deposited film was prepared in a similar manner to Example 156, and an evaluation of the oxygen transmission rate was made. The oxygen transmission rate of the vapor-deposited film from the first roll was 0.19 mL/m$^2$·day·atm.

Comparative Example 34

The unsaturated aldehyde (c-2) was not added to the resin composition obtained in Synthesis Example 5. The content of the volatile matter in the base film before the vapor deposition was 0.13% by mass. A vapor-deposited film was prepared in a similar manner to Example 156, and an evaluation of the oxygen transmission rate was made. The oxygen transmission rate of the vapor-deposited film from the first roll was 0.16 mL/m$^2$·day·atm.

Comparative Examples 35 and 36

A vapor-deposited film was prepared using the resin composition prepared in Synthesis Example 4 in a similar manner to Example 156 except that the content of crotonaldehyde was changes as shown in Table 11 and the film surface temperature was 62° C., and an evaluation of the oxygen transmission rate was made.

Comparative Example 37

The vapor-deposited film obtained in Comparative Example 33, as well as the unstretched polypropylene film and the stretched polyester film each used in Example 171 were laminated in a similar manner to Example 171, whereby a multilayer film having a stretched polyester film/vapor-deposited film/unstretched polypropylene film structure was prepared. The lamination was made such that the vapor deposition layer side of the vapor-deposited film was situated on the stretched polyester film side. The oxygen transmission rate was measured to be 0.34 mL/m$^2$·day·atm.

Comparative Example 38

The vapor-deposited film obtained in Comparative Example 33, as well as the unstretched polypropylene film, the vapor-deposited and stretched polyester film and the stretched polyamide film each used in Example 176 were laminated in a similar manner to Example 171, whereby a multilayer film having a stretched polyamide film/vapor-deposited and stretched polyester film/vapor-deposited film/unstretched polypropylene film structure was prepared. It is to be noted that this multilayer film was prepared by attaching the vapor deposition surface of the vapor-deposited PET to the vapor deposition surface of the vapor-deposited film. The oxygen transmission rate was measured to be 0.19 mL/m$^2$·day·atm.

Preparation and Evaluation of Spout Pouch

Packaging Material Examples

Example 177

Preparation Method of Spout Pouch

Two pieces of multilayer film having a size of 20 cm×13 cm were cut out from the multilayer film prepared in Example 171. Subsequently, the two pieces of multilayer film thus cut out were overlaid on each other such that the CPPs were situated inside, then the outer periphery of the pieces of multilayer film were heat-sealed over a width of 0.5 cm, and further a polypropylene spout was attached by heat-sealing. A flat spout pouch was prepared in this way. This spout pouch was left to stand for one week in an atmosphere involving a temperature of 20° C. and a humidity of 85% RH, and thereafter the oxygen transmission rate was measured.

Oxygen Transmission Rate of Spout Pouch

Oxygen Transmission Rate of Entire Spout Pouch

First, a metal fixture to which two metal pipes for a carrier gas were connected to the opening of the spout of the pouch, and the metal fixture was secured to the opening of the spout using an epoxy adhesive such that a gas might not leak from a gap between the metal fixture and the spout. Next, the opposite end of one of the metal pipes was connected to an oxygen transmission rate meter ("MOCON OX-TRAN2/20" available from Modern Controls, Inc.). Thus, the carrier gas was released through the one of the metal pipes into the spout pouch, then circulated within the spout pouch, and thereafter flowed into an oxygen gas sensor of the oxygen transmission rate meter through the other of the metal pipes.

Subsequently, the pouch connected to the metal pipes was covered with a bag, then the two metal pipes were pulled out from the bag, and the bag was secured at the metal pipe portion with a string. The bag was prepared by heat-sealing a laminated film having a lamination structure of polyester/adhesion layer/ethylene-vinyl alcohol copolymer (EVOH) layer/adhesion layer/PO layer. Next, a gap between the bag and the metal pipe was filled with an epoxy resin, whereby gas-tightness of the bag was improved. Next, one hole was provided on the bag, then a pipe for supplying a gas was inserted into the hole, the bag and the pipe for supplying a gas were secured with an adhesive tape such that an ambient air might not flow into the bag from between the bag and the pipe.

Subsequently, a nitrogen gas containing 2% by volume of hydrogen gas as a gas and a carrier gas was allowed to flow into the aforementioned bag and pouch through the pipe and the metal pipe. Of the gas flowing in the bag, a first part thereof was transmitted through the pouch and flowed into the inside of the pouch, a second part thereof was transmitted through the bag and outflowed to the outside, and a third part outflowed from two connection portions (a connection point between the metal pipe and the bag, and a connection point between the pipe and the bag) to the outside. The concentration of the oxygen gas contained in the carrier gas passing through the metal pipe was measured by the oxygen gas sensor of the oxygen transmission rate meter. The gas and the carrier gas were continued to flow into the aforementioned bag and pouch until the oxygen concentration became constant. Then, the oxygen concentration when the oxygen concentration became constant was designated as a zero point of the oxygen transmission rate.

Thereafter, the gas flowing in the aforementioned bag was switched to a moisture-conditioned oxygen gas. More specifically, a state was attained in which a nitrogen gas flowed inside the pouch whereas the oxygen gas flowed outside the pouch. The oxygen gas transmitted from the outside to the inside of the pouch was transported to the oxygen gas sensor through the metal pipe by the carrier gas flowing inside the pouch, whereby the oxygen concentration was measured. Based on the oxygen concentration thus measured, the oxygen transmission rate (unit: mL/(m²·day·atm)) of the spout pouch was calculated. The measurement was made under conditions involving a temperature of 20° C., a humidity of 85% RH, an oxygen pressure of 1 atm, and a carrier gas pressure of 1 atm.

Oxygen Transmission Rate of Spout Itself

The oxygen transmission rate of the spout itself was measured in accordance with the following method. First, the spout portion protruding from the pouch was cut out from the spout pouch. Subsequently, one of the openings of the spout thus cut out was sealed with an aluminum foil. Thereafter, a metal fixture to which the two metal pipes for the carrier gas was connected to the other opening of the spout not sealed with the aluminum foil, and the metal fixture was secured to the spout using an epoxy adhesive such that a gas might not leak from a gap between the metal fixture and the spout. Next, the opposite end of the metal pipe was connected to the oxygen transmission rate meter ("MOCON OX-TRAN2/20" manufactured by Modern Controls, Inc.), whereby the carrier gas was enabled to flow into the spout through one of the metal pipes, to flow within the spout, and then to flow into the oxygen gas sensor of the oxygen transmission rate meter through the other of the metal pipes.

Subsequently, the spout connected to the metal pipes was covered with a bag, then the aforementioned two metal pipes were pulled out from the bag, and the bag was secured at the metal pipe portion with a string. The bag was prepared by heat-sealing a laminated film having a lamination structure of polyester/adhesion layer/EVOH layer/adhesion layer/PO layer. Next, a gap between the bag and the metal pipe was filled with an epoxy resin, whereby gas-tightness of the bag was improved. Next, one hole was provided on the bag, then a pipe for supplying a gas was inserted into the hole, and the bag and the pipe for supplying a gas were secured with an adhesive tape such that an ambient air might not flow into the bag from between the bag and the pipe.

Subsequently, a nitrogen gas containing 2% by volume of hydrogen gas as a gas and a carrier gas was allowed to flow into the aforementioned bag and spout through the pipe and the metal pipe. Of the carrier gas flowing in the bag, a first part thereof was transmitted through the spout and flowed into the inside of the spout, a second part thereof was transmitted through the bag and outflowed to the outside, and a third part outflowed from two connection portions (a connection point between the metal pipe and the bag, and a connection point between the pipe and the bag) to the outside. The concentration of the oxygen gas contained in the carrier gas passing through the metal pipe was measured by the oxygen gas sensor of the oxygen transmission rate meter. The gas and the carrier gas were continued to flow into the aforementioned bag and spout until the oxygen concentration became constant. Then, the oxygen concentration when the oxygen concentration became constant was designated as a zero point of the oxygen transmission rate.

Thereafter, the gas flowing in the aforementioned bag was switched to a moisture-conditioned oxygen gas. More specifically, a state was attained in which a nitrogen gas flowed inside the spout whereas the oxygen gas flowed outside the spout. The oxygen gas transmitted from the outside of the spout to the inside of the spout was transported to the oxygen gas sensor through the metal pipe by the carrier gas flowing inside the spout, whereby the oxygen concentration was measured. Based on the oxygen concentration thus measured, the oxygen transmission rate (unit: mL/(m²·day·atm)) of the spout was calculated. The measurement was carried out under the conditions involving a temperature of 20° C., a humidity of 85% RH, an oxygen pressure of 1 atm, and a carrier gas pressure of 1 atm.

Oxygen Transmission Rate of Multilayer Film

Based on the oxygen transmission rate of each of the spout pouch and the spout as measured according to the aforementioned methods, the oxygen transmission rate per unit area of the multilayer film was calculated using the following equation:

[oxygen transmission rate of spout pouch]=([oxygen transmission rate of multilayer film]×[surface area of multilayer film]+[oxygen transmission rate of spout]×[surface area of spout])/([surface area of multilayer film]+[surface area of spout])

Comparative Example 39

A spout pouch of Comparative Example 39 was prepared in a similar manner to Example 177 except that the multilayer film prepared in Comparative Example 37 was used in place of the multilayer film used in Example 177. The oxygen transmission rate of this spout pouch was determined according to a similar method to Example 177. The were overlaid on each other such that the CPP layers were situated inside, and three sides thereof were heat-sealed over a width of 10 mm, whereby a three-side-seal bag was prepared. Next, a thermally insulating core material was packed in the three-side-seal bag through the opening of the three-side-seal bag, and the three-side-seal bag was sealed using a vacuum packaging machine (VAC-STAR 2500 manufactured by Frimark GmbH) at a temperature of 20° C. and an inner pressure of 10 Pa, whereby a vacuum thermal insulator was obtained. Silica fine powder dried in an atmosphere at 120° C. for 4 hours was used as the thermally insulating core material. After the vacuum thermal insulator thus obtained was left to stand at 40° C. and 15% RH for 360 days, the pressure inside the vacuum thermal insulator was measured with a Pirani gauge.

Comparative Example 40

A vacuum thermal insulator of Comparative Example 40 was prepared in a similar manner to Example 178 except that the multilayer film prepared in Comparative Example 38 was used in place of the multilayer film used in Example 178. After this vacuum thermal insulator was left to stand at 40° C. and 15% RH for 360 days, the pressure inside the vacuum thermal insulator was measured with a Pirani gauge. The results of the evaluations of the vacuum thermal insulators of Example and Comparative Example are shown in Table 14.

TABLE 11

| | Resin composition | Unsaturated aldehyde substance name | content, ppm | Film surface temperature ° C. | Vapor deposition thickness nm | Volatile matter after vapor deposition g | Vapor deposition defects first roll | time-dependent change | Adhesive strength first roll | time-dependent change | OTR (mL/m²·day·atm) first roll | hundredth roll |
|---|---|---|---|---|---|---|---|---|---|---|---|---|
| Example 156 | Synthesis Example 4 | croton-aldehyde | 2.9 | 38 | 70 | 0.13 | A | A | A | A | 0.05 | 0.05 |
| Example 157 | Synthesis Example 4 | croton-aldehyde | 0.13 | 38 | 70 | 0.13 | A | A | A | A | 0.06 | 0.06 |
| Example 158 | Synthesis Example 4 | croton-aldehyde | 48 | 43 | 70 | 0.13 | B | A | B | A | 0.07 | 0.07 |
| Example 159 | Synthesis Example 4 | croton-aldehyde | 98 | 48 | 70 | 0.13 | B | B | B | B | 0.08 | 0.1 |
| Example 160 | Synthesis Example 4 | croton-aldehyde | 0.07 | 53 | 70 | 0.13 | B | A | C | A | 0.07 | 0.07 |
| Example 161 | Synthesis Example 4 | 2,4-hexadienal | 2.9 | 53 | 70 | 0.4 | B | B | C | B | 0.08 | 0.1 |
| Example 162 | Synthesis Example 4 | 2,4,6-octatrienal | 2.9 | 53 | 70 | 0.68 | C | B | D | B | 0.09 | 0.11 |
| Example 163 | Synthesis Example 4 | croton-aldehyde | 2.9 | 53 | 70 | 0.93 | B | A | D | A | 0.07 | 0.07 |
| Example 164 | Synthesis Example 4 | croton-aldehyde | 2.9 | 38 | 70 | 1.02 | A | A | C | A | 0.07 | 0.07 | results of the evaluations of the spout pouches of Example and Comparative Example are shown in Table 13.

Preparation and Evaluation of Vacuum Thermal Insulator

Example 178

The multilayer film prepared in Example 176 was cut, whereby two pieces of multilayer film having a size of 70 cm×30 cm were obtained. The two pieces of multilayer film

TABLE 12

| | Layer structure | OTR (mL/m²·day·atm) |
|---|---|---|
| Example 171 | PET/Example 156/CPP | 0.09 |
| Example 172 | vapor-deposited PET/Example 156/CPP | 0.04 |
| Example 173 | PET/Example 156/Example 156/CPP | <0.01 |

TABLE 12-continued

| | Layer structure | OTR (mL/m$^2$ · day · atm) |
|---|---|---|
| Example 174 | PET/Example 169/CPP | 0.03 |
| Example 175 | PET/Example 174/CPP | 0.03 |
| Example 176 | ON/vapor-deposited PET/Example 156/CPP | 0.04 |
| Comparative Example 37 | PET/Comparative Example 33/CPP | 0.34 |
| Comparative Example 38 | ON/vapor-deposited PET/Comparative Example 33/CPP | 0.19 |

TABLE 13

| | Layer structure | OTR of multilayer film (mL/m$^2$ · day · atm) |
|---|---|---|
| Example 177 | PET/Example 156/CPP | <0.01 |
| Comparative Example 39 | PET/Comparative Example 33/CPP | 0.03 |

TABLE 14

| | Layer structure | Inner pressure after left to stand at 40° C. for 360 days (Pa) |
|---|---|---|
| Example 178 | ON/vapor-deposited PET/Example 156/CPP | 31 |
| Comparative Example 40 | ON/vapor-deposited PET/Comparative Example 33/CPP | 73 |

As shown in Table 11, the base film constituted with the resin composition containing the vinyl alcohol polymer (A2) inhibited vapor deposition voids which would be generated in the vapor deposition. The vapor-deposited film including the obtained metal vapor deposition layer inhibited the deterioration of the gas barrier properties.

As shown in Table 12, the multilayer film exhibited superior oxygen barrier properties when the base film contained the unsaturated aldehyde (c-2).

As shown in Table 13, the spout pouch exhibited superior oxygen barrier properties when the base film contained the unsaturated aldehyde (c-2).

As shown in Table 14, the vacuum thermal insulator of the Example maintained a high degree of vacuum even after a storage test at 40° C. and 15% RH for 360 days.

As set forth in the foregoing, the vacuum thermal insulator including the gas barrier layer according to the embodiment of the present invention exhibited superior characteristics over a long time period.

INDUSTRIAL APPLICABILITY

The resin composition of the embodiment of the present invention achieves superior appearance characteristics such as a color of a film end (or a roll end) after melt molding, film-breaking resistance, blocking resistance, vapor deposition defects-inhibiting properties, and adhesive strength of a vapor deposition layer. The film according to the embodiment of the present invention is superior in appearance characteristics such as a color of a film end (for example, a roll end), film-breaking resistance and blocking resistance.

According to the method for producing the film according to the embodiment of the present invention, a film more superior in appearance characteristics such as a color of a film end (for example, a roll end), film-breaking resistance and blocking resistance can be produced. The laminate according to the embodiment of the present invention exhibits less vapor deposition defects, and superior adhesive strength between the vapor deposition layer and the film or the like. The packaging material according to the embodiment of the present invention is superior in appearance characteristics and film-breaking resistance. The vacuum thermal insulator according to the embodiment of the present invention is superior in gas barrier properties. Therefore, these can be suitably used as various packaging materials.

The invention claimed is:

1. A resin composition, comprising:
an ethylene-vinyl alcohol copolymer (A);
inorganic particles (B); and
an aliphatic carbonyl compound (C) having 3 to 8 carbon atoms,
wherein
a content of the inorganic particles (B) is 50 ppm or greater and 5,000 ppm or less,
the aliphatic carbonyl compound (C) is a saturated ketone,
the saturated ketone is at least one selected from the group consisting of acetone, methyl ethyl ketone and 2-hexanone, and
a content of the aliphatic carbonyl compound (C) is 0.01 ppm or greater and 100 ppm or less.

2. The resin composition according to claim 1, wherein the inorganic particles (B) comprise a metal element which is at least one selected from the group consisting of silicon, aluminum, magnesium, zirconium cerium, tungsten and molybdenum.

3. The resin composition according to claim 1, wherein the aliphatic carbonyl compound (C) is at least one selected from the group consisting of acetone and methyl ethyl ketone.

4. A film formed from the resin composition according to claim 1.

5. A laminate, comprising:
a layer comprising the film according to claim 4; and
at least one other layer comprising other component.

6. The laminate according to claim 5, wherein the other layer is a metal vapor deposition layer.

7. The laminate according to claim 6, wherein the laminate comprises two or more metal vapor deposition layers as the other layer on one side or both sides of the film.

8. The laminate according to claim 6, wherein a sum of the average thickness of the metal vapor deposition layer(s) on one side of the film is 15 nm or greater and 150 nm or less.

9. A packaging material, comprising the film according to claim 4.

10. A packaging material, comprising the laminate according to claim 5.

11. A vacuum thermal insulator, comprising the laminate according to claim 6.

12. A method for producing the film according to claim 4, the method comprising:
cast-molding the resin composition.

13. A method for producing the film according to claim 4, the method comprising:
stretching the film formed from the resin composition.

14. A method for producing the laminate according to claim 6, the method comprising:
forming the metal vapor deposition layer on the film,
wherein a surface temperature of the film in forming the metal vapor deposition layer is 60° C. or less.

* * * * *